(12) United States Patent
Gu

(10) Patent No.: US 11,594,172 B2
(45) Date of Patent: Feb. 28, 2023

(54) DISPLAY DEVICE HAVING AN ENLARGED DISPLAY AREA

(71) Applicant: Samsung Display Co., Ltd., Yongin-Si (KR)

(72) Inventor: Bon-Seog Gu, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/343,592

(22) Filed: Jun. 9, 2021

(65) Prior Publication Data

US 2022/0036810 A1 Feb. 3, 2022

(30) Foreign Application Priority Data

Jul. 30, 2020 (KR) ........................ 10-2020-0095485

(51) Int. Cl.
| | |
|---|---|
| *G09G 3/32* | (2016.01) |
| *G06T 7/11* | (2017.01) |
| *H01L 33/58* | (2010.01) |
| *G09G 3/00* | (2006.01) |
| *H01L 27/32* | (2006.01) |

(52) U.S. Cl.
CPC .................. *G09G 3/32* (2013.01); *G06T 7/11* (2017.01); *G06T 2207/20021* (2013.01); *G09G 3/035* (2020.08); *G09G 2300/0439* (2013.01); *G09G 2310/0267* (2013.01); *G09G 2330/021* (2013.01); *H01L 27/3232* (2013.01); *H01L 33/58* (2013.01)

(58) Field of Classification Search
CPC .. G09G 3/03; G09G 3/035; G09G 3/32–3291; G09G 2300/0408; G09G 2300/0421; G09G 2300/0426; G09G 2300/0439; G09G 2310/0243; G09G 2310/0264; G09G 2310/0281; G09G 2310/0286; G09G 2310/06; G09G 2310/08; G09G 2320/0233; G09G 2320/0242; G09G 2320/028; G09G 2330/021; G09G 2380/02; G06T 7/10; G06T 7/11; G06T 2207/20021; H01L 27/32; H01L 27/3225; H01L 27/3232; H01L 33/58; H01L 33/60
See application file for complete search history.

(56) References Cited

U.S. PATENT DOCUMENTS

| | | |
|---|---|---|
| 9,858,865 B2 | 1/2018 | Gu et al. |
| 9,934,727 B2 | 4/2018 | Pyon |

(Continued)

FOREIGN PATENT DOCUMENTS

| | | |
|---|---|---|
| KR | 10-2015-0049640 A | 5/2015 |
| KR | 10-2017-0047446 A | 5/2017 |

(Continued)

*Primary Examiner* — Nathan Danielsen
(74) *Attorney, Agent, or Firm* — Innovation Counsel LLP

(57) ABSTRACT

Disclosed is a display device. The display device includes a display panel having a base layer, a circuit element layer disposed on the base layer, a display panel including a plurality of first pixels disposed in a first display area, and a plurality of second pixels disposed in a second display area adjacent to the first display area. The display device further includes a gate driver disposed in the second display area of the display panel and configured to drive the first and second pixels and a diffraction pattern layer including a plurality of second diffraction patterns disposed on the second pixels.

20 Claims, 23 Drawing Sheets

(56) References Cited

U.S. PATENT DOCUMENTS

| | | | |
|---|---|---|---|
| 10,095,272 B2 | 10/2018 | Park et al. | |
| 10,147,777 B2 | 12/2018 | Lim et al. | |
| 2013/0002641 A1* | 1/2013 | Kim .................... | G09G 3/3685 |
| | | | 345/212 |
| 2015/0310801 A1* | 10/2015 | Lin ..................... | G09G 3/3225 |
| | | | 345/205 |
| 2018/0173036 A1* | 6/2018 | Kim .................... | G09G 3/3406 |
| 2019/0088904 A1* | 3/2019 | Cho .................... | G09G 3/3208 |
| 2020/0028120 A1* | 1/2020 | Sugitani ............... | G02F 1/0316 |
| 2020/0410940 A1* | 12/2020 | Kim ....................... | G09G 3/20 |

FOREIGN PATENT DOCUMENTS

| | | |
|---|---|---|
| KR | 10-2018-0018960 A | 2/2018 |
| KR | 10-1878189 B1 | 7/2018 |
| KR | 10-2019-0036461 A | 4/2019 |

* cited by examiner

FIG. 1B
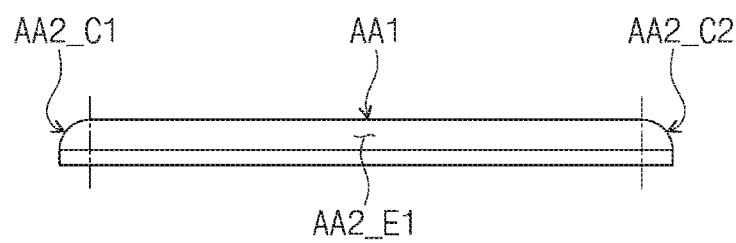
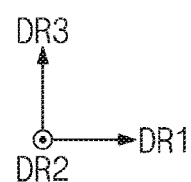
FIG. 1C
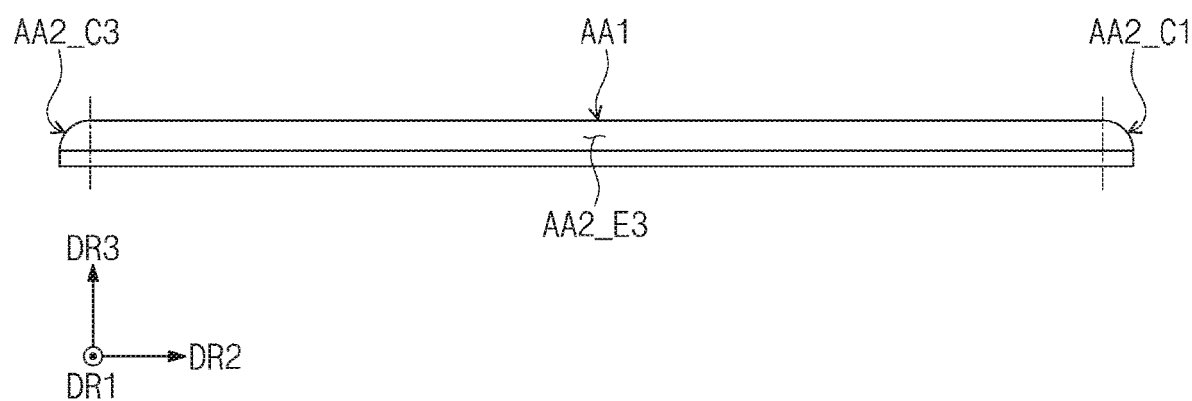
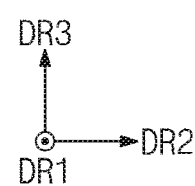

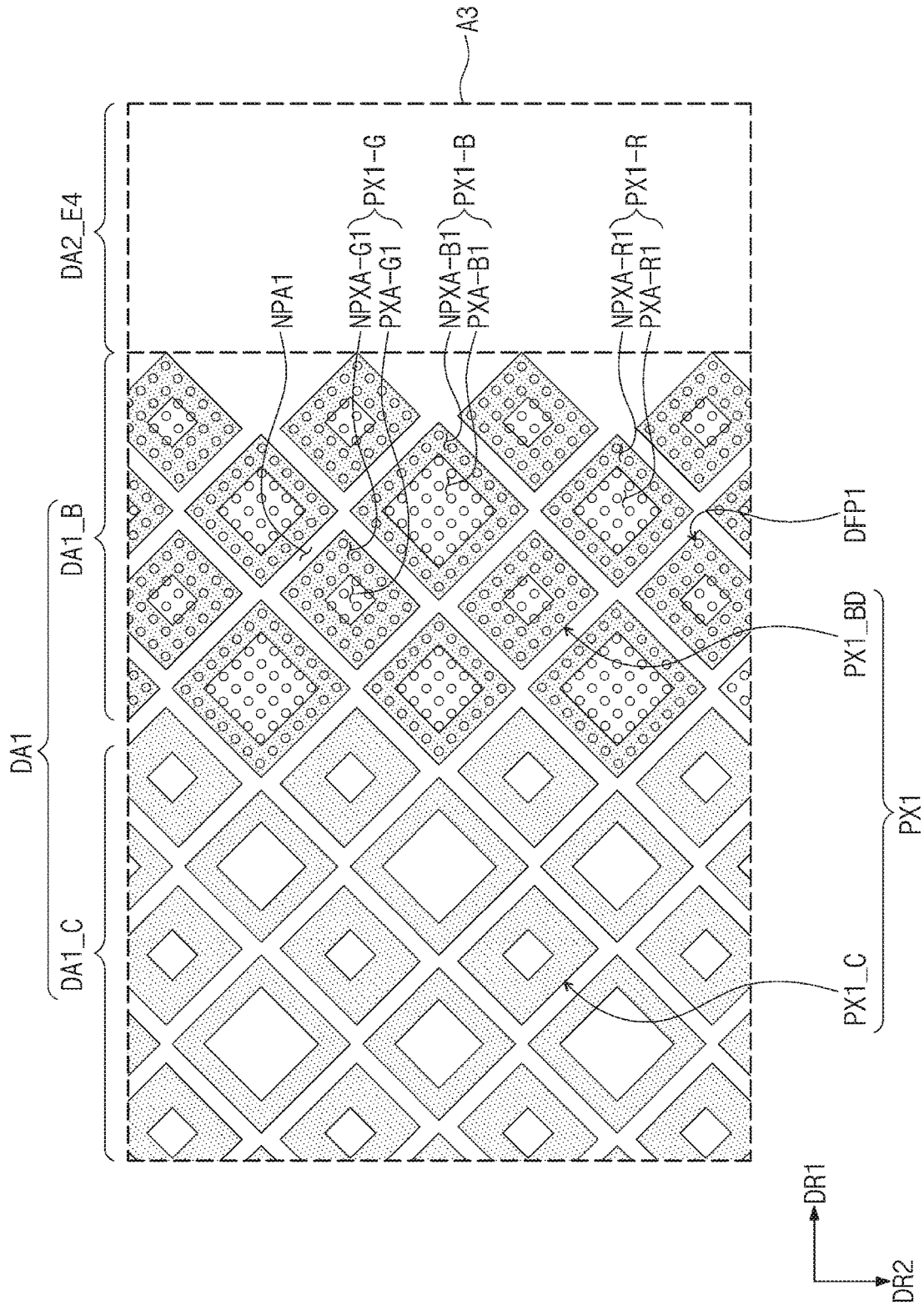

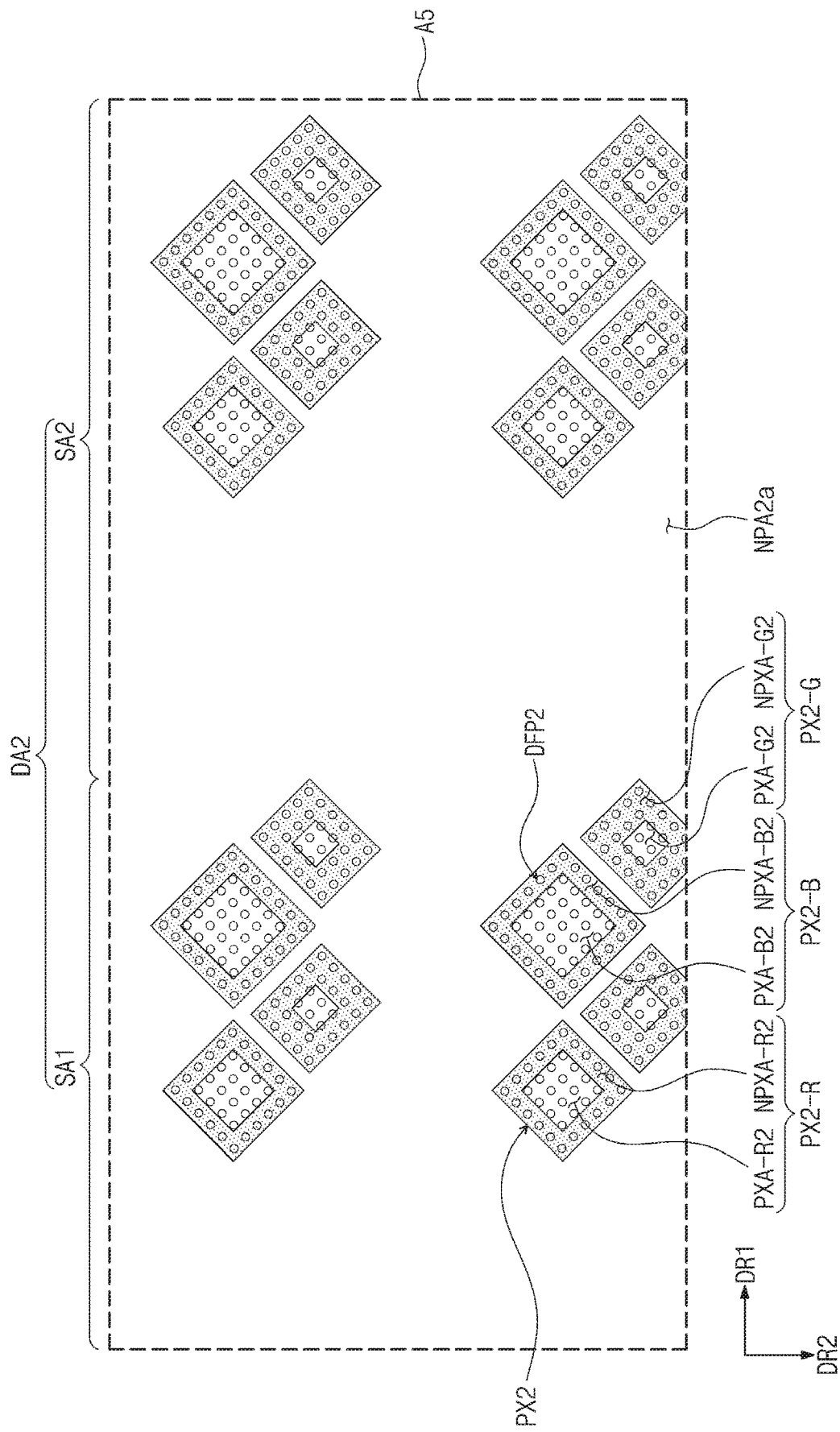

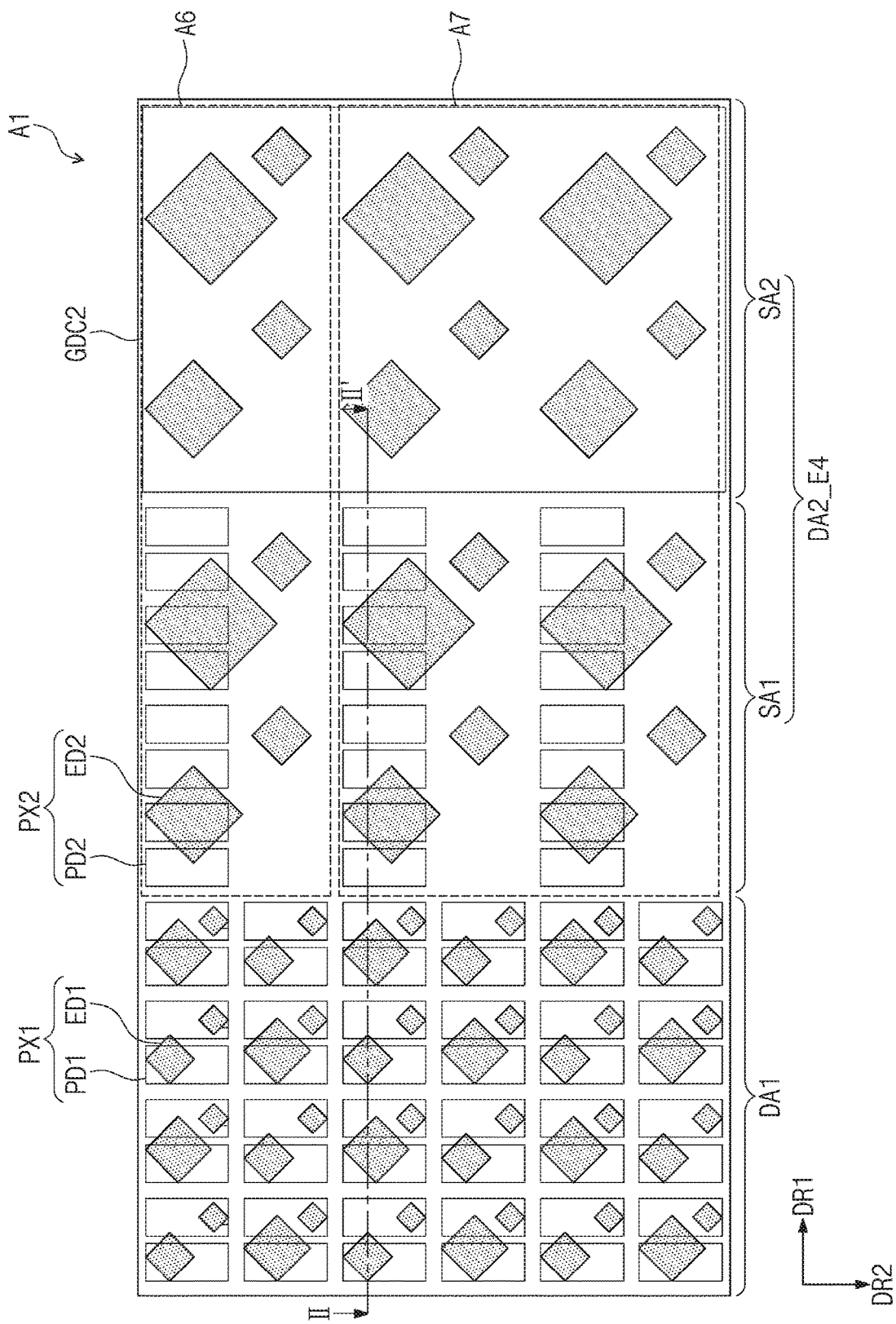

DISPLAY DEVICE HAVING AN ENLARGED DISPLAY AREA

CROSS-REFERENCE TO RELATED APPLICATIONS

This U.S. non-provisional patent application claims priority under 35 U.S.C. § 119 of Korean Patent Application No. 10-2020-0095485, filed on Jul. 30, 2020, the entire contents of which are hereby incorporated by reference.

BACKGROUND

The present disclosure generally relates to a display device, and more particularly, to a display device having an enlarged display area.

Various electronic devices used in multimedia devices such as televisions, mobile phones, tablet computers, navigation systems, or game consoles have been developed.

Recently, according to market demands, research is being conducted to reduce the area in which an image is not displayed in an electronic device. At the same time, research is being conducted to enlarge a display area in which an image is displayed to a user in an electronic device. Furthermore, aesthetically, it is much better to have a small bezel area than to have a large bezel area, thus, there is need to develop a novel display device in which a display area is enlarged and a bezel area is diminished.

SUMMARY

The present disclosure provides a display device in which a display area is enlarged by reducing the width of a bezel area.

An embodiment of the present disclosure provides a display device including a display panel including a plurality of first pixels disposed in a first display area and a plurality of second pixels disposed in a second display area adjacent to the first display area, a gate driver disposed in the second display area of the display panel and configured to drive the first and second pixels, and a diffraction pattern layer including a plurality of second diffraction patterns disposed on the second pixels.

BRIEF DESCRIPTION OF THE FIGURES

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings:

FIG. 1B is a side view of the display device illustrated in FIG. 1A as viewed from a second direction;

FIG. 1C is a side view of the display device illustrated in FIG. 1A as viewed from a first direction;

FIG. 4A is a plan view illustrating a relationship between a diffraction pattern layer and first pixels in an area A3 shown in FIG. 3A;

FIG. 7 is a plan view illustrating a relationship between a diffraction pattern layer and second pixels in an area A5 shown in FIG. 6;

FIG. 8A is an enlarged plan view of an area A1 shown in FIG. 2B according to still another;

DETAILED DESCRIPTION

Figure 1A:
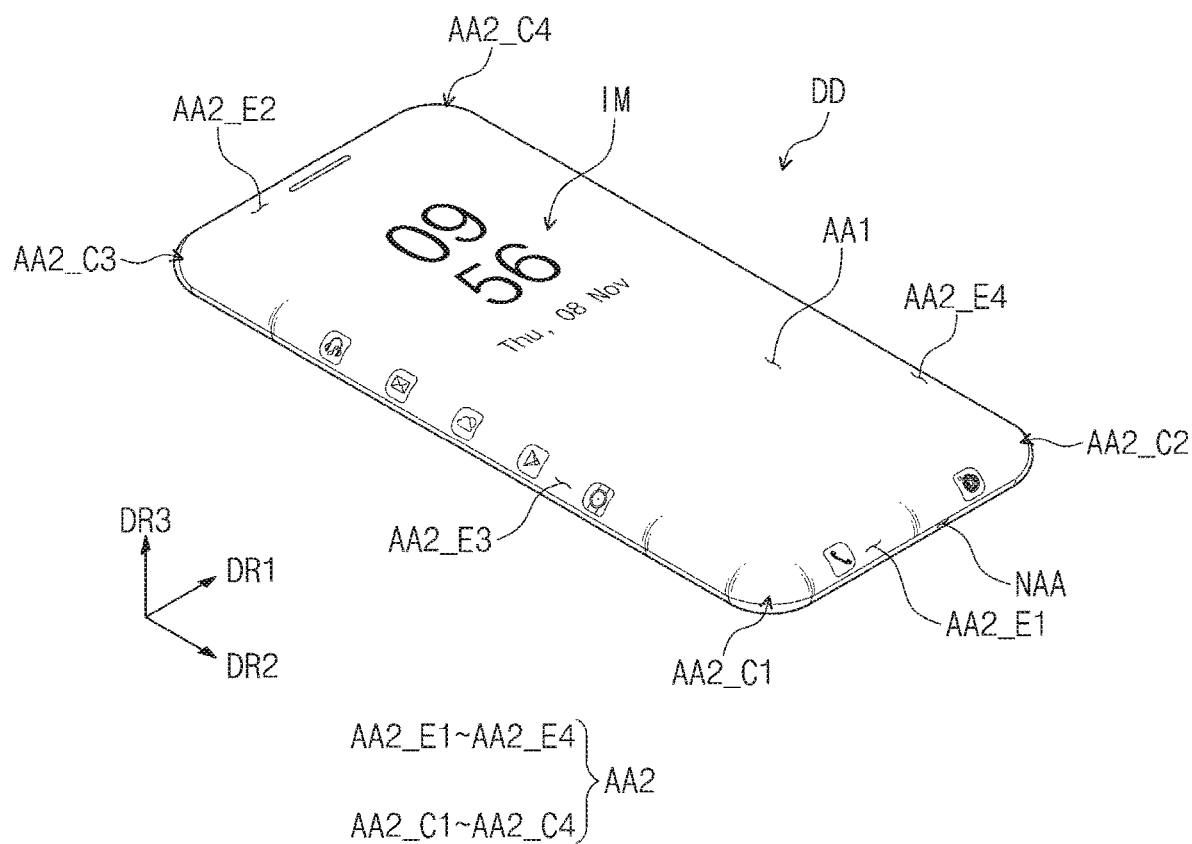
FIG. 1A is a perspective view of a display device according to an embodiment of the present disclosure.

In this specification, when an element (or region, layer, part, etc.) is referred to as being "on", "connected to", or "coupled to" another element, it means that it can be directly placed on/connected to/coupled to other components, or a third component can be arranged between them.

Like reference numerals refer to like elements. Additionally, in the drawings, the thicknesses, proportions, and dimensions of components are exaggerated for effective description. "And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the present disclosure. The terms of a singular form may include plural forms unless otherwise specified.

In addition, terms such as "below", "the lower side", "on", and "the upper side" are used to describe a relationship of components shown in the drawing. The terms are described as a relative concept based on a direction shown in the drawing.

In various embodiments of the present disclosure, the term "include," "comprise," "including," or "comprising," specifies a property, a region, a fixed number, a step, a process, an element and/or a component but does not exclude other properties, regions, fixed numbers, steps, processes, elements and/or components.

Unless otherwise defined, all terms (including technical and scientific terms) used herein have the same meaning as commonly understood by one of ordinary skill in the art to which this present disclosure belongs. In addition, terms defined in a commonly used dictionary should be interpreted as having a meaning consistent with the meaning in the context of the related technology, and unless interpreted in an ideal or overly formal sense, the terms are explicitly defined herein.

Hereinafter, embodiments of the present disclosure will be described with reference to the drawings.

FIG. 1A is a perspective view of a display device according to an embodiment of the present disclosure, FIG. 1B is a side view of the display device shown in FIG. 1A viewed from a second direction, and FIG. 1C is a side view of the display device shown in FIG. 1A viewed from a first direction.

FIGS. 1A, 1B, and 1C illustrate that a display device DD is a smart phone. However, the present disclosure is not limited thereto, and the display device DD may be a small and medium-sized electronic device such as a mobile phone, a tablet, a car navigation system, a game machine, a smart watch, and the like in addition to a large electronic device such as a television, a monitor, and the like.

Active areas AA1 and AA2 in which an image IM is displayed and a peripheral area NAA in which the image IM is not displayed may be defined in the display device DD. In FIG. 1A, the image IM including a date image, a time image, and an icon image is shown.

The active areas AA1 and AA2 may include a first active area AA1 having a planar shape and a second active area AA2 extended from the first active area AA1. The second active area AA2 may be an area curved from the first active area AA1 with a predetermined curvature. However, the shape of the second active area AA2 is not limited thereto. For example, the second active area AA2 may have a planar shape that is parallel to the first active area AA1 or inclined or perpendicular to the first active area AA1. The first and second active areas AA1 and AA2 are only geometrically divided areas, and may substantially implement one display surface. The peripheral area NAA is an area where the image IM is not displayed. The bezel area of the display device DD may be defined by the peripheral area NAA.

The first active area AA1 is parallel to a plane defined by a first direction DR1 and a second direction DR2. The normal direction of the first active area AA1, that is, the thickness direction of the display device DD, may be parallel to a third direction DR3. The front (or upper) and rear (or lower) surfaces of the members of the display device DD are divided by the third direction DR3. However, the directions indicated by the first to third directions DR1, DR2, and DR3 are relative concepts and may be converted to other directions.

The second active area AA2 may be an area bent and extended from the first active area AA1. The second active area AA2 may include first to fourth edge active areas AA2_E1, AA2_E2, AA2_E3, and AA2_E4 bent from each side of the first active area AA1, and first to fourth corner active areas AA2_C1, AA2_C2, AA2_C3, and AA2_C4 bent from each corner of the first active area AA1. The second active area AA2 includes the first edge active area AA2_E1 bent from a first side of the first active area AA1, the second edge active area AA2_E2 bent from a second side of the first active area AA1, the third edge active area AA2_E3 bent from a third side of the first active area AA1, and the fourth edge active area AA2_E4 bent from a fourth side of the first active area AA1. Each of the first to fourth edge active areas AA2_E1, AA2_E2, AA2_E3, and AA2_E4 may be curved to have a predetermined curvature in the third direction DR3. Each of the first to fourth edge active areas AA2_E1, AA2_E2, AA2_E3, and AA2_E4 may have a single curved shape. FIG. 1A illustrates a shape in which the first to fourth edge active areas AA2_E1, AA2_E2, AA2_E3, and AA2_E4 are curved with the same curvature, but the present disclosure is not limited thereto. For example, the first and second edge active areas AA2_E1 and AA2_E2 may be bent with a different curvature from the third and fourth edge active areas AA2_E3 and AA2_E4.

The second active area AA2 further includes the first corner active area AA2_C1 bent from a first corner of the first active area AA1, the second corner active area AA2_C2 bent from a second corner of the first active area AA1, the third corner active area AA2_C3 bent from a third corner of the first active area AA1, and the fourth corner active area AA2_C4 bent from a fourth corner of the first active area AA1.

The first corner active area AA2_C1 is disposed between the first edge active area AA2_E1 and the third edge active area AA2_E3, and the second corner active area AA2_C2 is disposed between the first edge active area AA2_E1 and the fourth edge active area AA2_E4. The third corner active area AA2_C3 is disposed between the second edge active area AA2_E2 and the third edge active area AA2_E3, and the fourth corner active area AA2_C4 is disposed between the second edge active area AA2_E2 and the fourth edge active area AA2_E4.

Each of the first to fourth corner active areas AA2_C1, AA2_C2, AA2_C3, and AA2_C4 may be curved to have a predetermined curvature in the third direction DR3. Each of the first to fourth corner active areas AA2_C1, AA2_C2, AA2_C3, and AA2_C4 may have a double curved shape.

The number of edge active areas AA2_E1 to AA2_E4 and corner active areas AA2_C1, AA2_C2, AA2_C3, and AA2_C4 is not limited thereto. That is, the number of edge active areas AA2_E1, AA2_E2, AA2_E3, and AA2_E4 and the number of corner active areas AA2_C1, AA2_C2, AA2_C3, and AA2_C4 which are included in the second active area AA2 may vary according to the shape of the first active area AA1. In addition, at least one of the edge active areas AA2_E1, AA2_E2, AA2_E3, and AA2_E4 and the corner active areas AA2_C1, AA2_C2, AA2_C3, and AA2_C4 may be omitted.

In an embodiment of the present disclosure, a first image displayed in the first active area AA1 and a second image displayed in the second active area AA2 may be dependent on each other. For example, a picture, a scene of a movie, or a UX/UI design may be formed by a combination of the first image and the second image. The aesthetic feeling of the display device DD may be improved by the second active area AA2 bent at a predetermined curvature, and the area of the peripheral area NAA recognized by the user may be reduced.

Figure 2A:
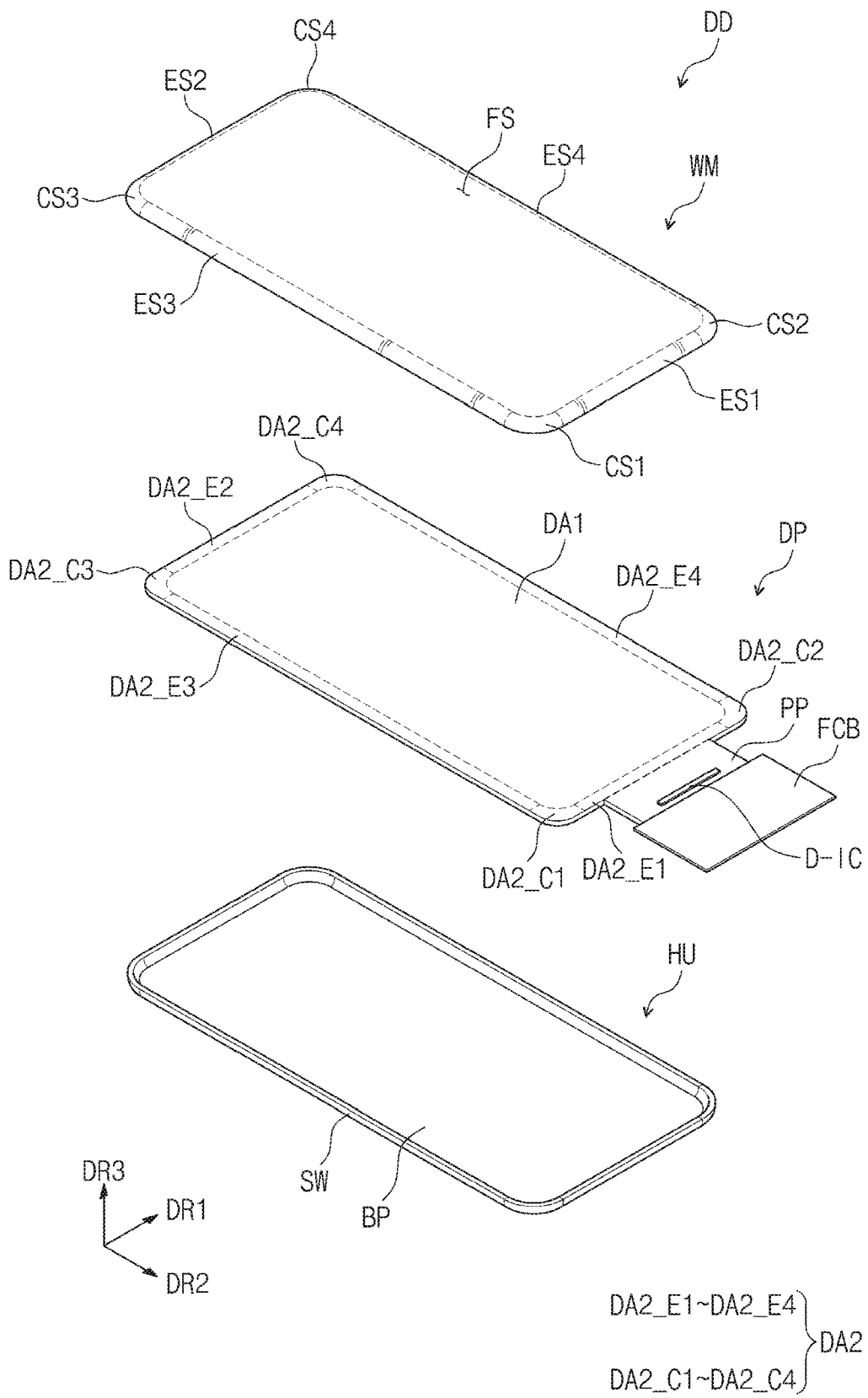
FIG. 2A is an exploded perspective view of a display device according to an embodiment of the present disclosure.
Figure 2B:
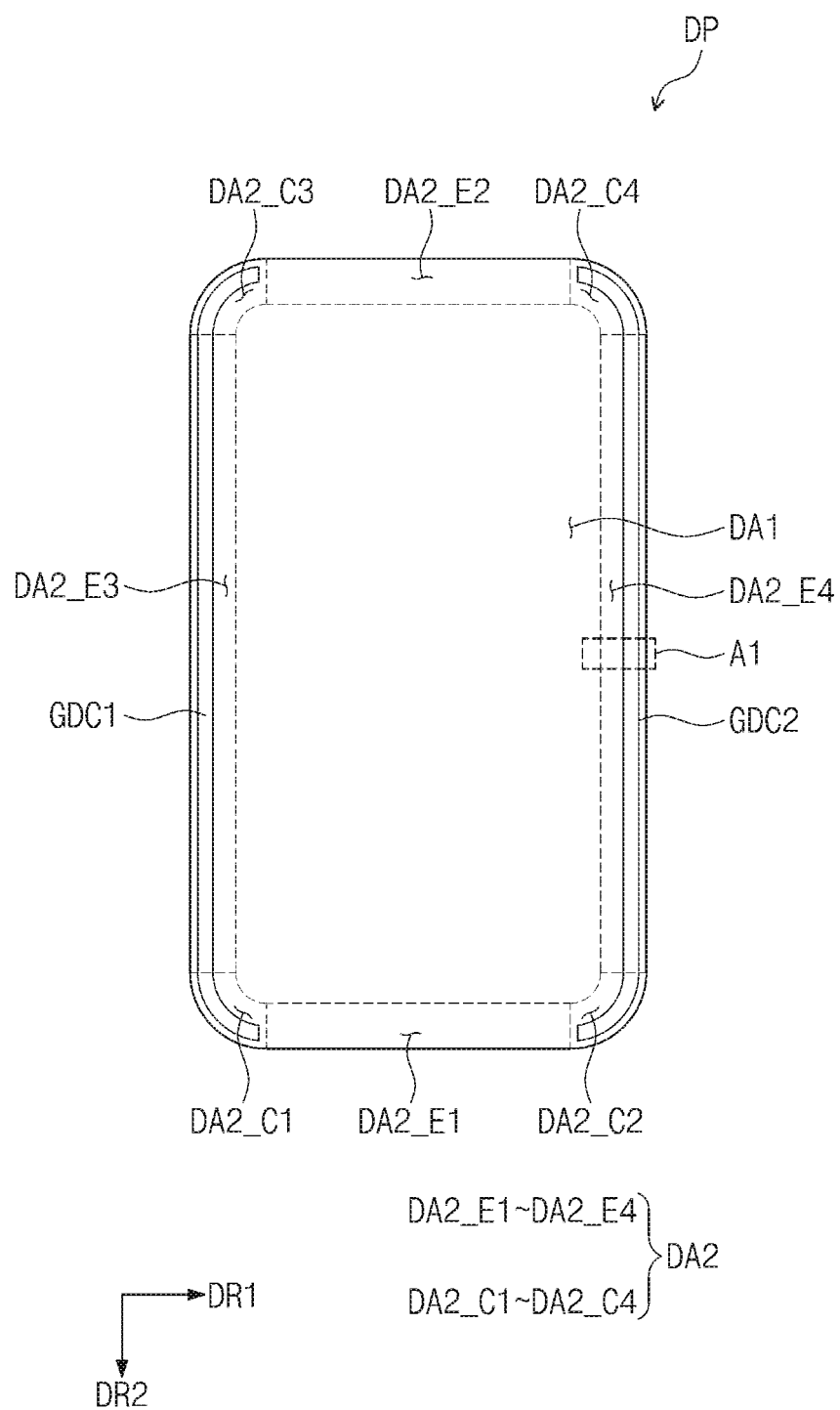
FIG. 2B is a plan view of a display panel according to an embodiment of the present disclosure.

FIG. 2A is an exploded perspective view of a display device according to an embodiment of the present disclosure, and FIG. 2B is a plan view of a display panel according to an embodiment of the present disclosure.

Referring to FIG. 2A, a display device DD may include a window WM, a display panel DP, and a housing HU. The window WM protects the upper surface of the display panel DP. The window WM may be optically transparent. Accordingly, the image displayed on the display panel DP may pass through the window WM and be visually recognized by the user. That is, a display surface of the display device DD may be defined by the window WM. The window WM may be made of glass, plastic, or film.

The window WM may have a curved structure. The window WM may include a front part FS and one or more curved parts bent from the front part FS. Here, the front part FS and the one or more curved parts may be defined as a transmission part that transmits an image or light. The front part FS of the window WM may define a first active area AA1 (see FIG. 1A) of the display device DD, and the one or more curved parts may define a second active area AA2 (see FIG. 1A).

As an example of the present disclosure, a window WM includes four curved parts, that is, a first curved part ES1, a second curved part ES2, a third curved part ES3, and a fourth curved part ES4. In this embodiment, the front part FS may be a plane defined by the first direction DR1 and the second direction DR2. The front part FS may be perpendicular to the third direction DR3. Each of the first to fourth curved parts ES1, ES2, ES3, and ES4 is bent from the front part FS.

The first and second curved parts ES1 and ES2 may be bent from first and second sides of the front part FS, respectively. The first and second sides of the front part FS may be parallel to the first direction DR1. That is, the first side is disposed opposite to the second side. The first curved part ES1 and the second curved part ES2 may be arranged parallel to each other in the first direction DR1. The third and fourth curved parts ES3 and ES4 may be bent from third and fourth sides of the front part FS, respectively. The third and fourth sides of the front part FS may be parallel to the second direction DR2. That is, the third side is disposed opposite to the fourth side. The third curved part ES3 and the fourth curved part ES4 may be arranged parallel to each other in the second direction DR2.

The first to fourth curved parts ES1, ES2, ES3, and ES4 may be bent at a predetermined curvature from the front part FS. As an example of the present disclosure, the first to fourth curved parts ES1, ES2, ES3, and ES4 may have the same curvature. As another example, the first and second curved parts ES1 and ES2 may have the same curvature, and the third and fourth curved parts ES3 and ES4 may have the same curvature. In this case, the first and second curved parts ES1 and ES2 may have a different curvature from the third and fourth curved parts ES3 and ES4.

The window WM may further include at least one corner part. As an example of the present disclosure, the window WM may further include four corner parts, that is, a first corner part CS1, a second corner part CS2, a third corner part CS3, and a fourth corner part CS4. Each of the first to fourth corner parts CS1, CS2, CS3, and CS4 may be a double curved part having at least two or more curvatures. Each of the first to fourth corner parts CS1, CS2, CS3, and CS4 may have a shape in which curved surfaces having different curvatures are continuously connected.

The first corner part CS1 is disposed between the first curved part ES1 and the third curved part ES3, and one end of the first corner part CS1 is connected to the first curved part ES1, and the other end of the first corner part CS1 is connected to the third curved part ES3. The second corner part CS2 is disposed between the first curved part ES1 and the fourth curved part ES4, and one end of the second corner part CS2 is connected to the first curved part ES1, and the other end of the second corner part CS2 is connected to the fourth curved part ES4. The third corner part CS3 is disposed between the second curved part ES2 and the third curved part ES3, and one end of the third corner part CS3 is connected to the second curved parts ES2, and the other end of the third corner part CS3 is connected to the third curved part ES3. The fourth corner part CS4 is disposed between the second curved part ES2 and the fourth curved part ES4, and one end of the fourth corner part CS4 is connected to the second curved part ES2, and the other end of the fourth corner part CS4 is connected to the fourth curved part ES4. Here, each of the first to fourth corner parts CS1, CS2, CS3, and CS4 may be defined as a transmission part that transmits an image or light.

Referring to FIGS. 2A and 2B, the display panel DP may include a display area for displaying an image. As an example of the present disclosure, the display area may include a first display area DA1 and a second display area DA2. The first display area DA1 is disposed parallel to the front part FS of the window WM, and may have a shape corresponding to the front part FS. That is, the first display area DA1 may be a flat display area having a planar shape. The second display area DA2 is disposed corresponding to one or more curved parts and one or more corner parts. The second display area DA2 may have one or more curved parts and a curved shape corresponding to one or more corner parts. However, the shape of the second display area DA2 is not limited thereto, and the second display area DA2 may also have a planar shape.

The second display area DA2 includes first to fourth edge display areas DA2_E1, DA2_E2, DA2_E3, and DA2_E4 arranged to correspond to the first to fourth curved parts ES1, ES2, ES3, and ES4, respectively. The first and second edge display areas DA2_E1 and DA2_E2 may be bent from first and second sides of the first display area DA1, and may be disposed to correspond to the first and second curved parts ES1 and ES2 of the window WM, respectively. Here, the first and second sides of the first display area DA1 are parallel to the first direction DR1. The first and second edge display areas DA2_E1 and DA2_E2 may be bent from the first display area DA1 at a predetermined curvature.

The third and fourth edge display areas DA2_E3 and DA2_E4 may be bent from third and fourth sides of the first display area DA1, and may be disposed to correspond to the third and fourth curved parts ES3 and ES4 of the window WM, respectively. Here, the third and fourth sides of the first display area DA1 are parallel to the second direction DR2. The third and fourth edge display areas DA2_E3 and DA2_E4 may be bent from the first display area DA1 at a predetermined curvature.

In the above, a structure in which the second display area DA2 includes four edge display areas DA2_E1, DA2_E2, DA2_E3, and DA2_E4 in the display panel DP according to an embodiment has been described above but the structure of the display panel DP according to the present disclosure is not limited thereto. That is, the second display area DA2 of the display panel DP may include only one edge display area, or may include only two edge display areas provided on the first and second sides of the first display area DA1 or on the third and fourth sides.

The second display area DA2 may further include first to fourth corner display areas DA2_C1, DA2_C2, DA2_C3, and DA2_C4 disposed to correspond to the first to fourth corner parts CS1, CS2, CS3, and CS4 of the window WM, respectively. The first corner display area DA2_C1 is disposed between the first and third edge display areas DA2_E1 and DA2_E3, and the second corner display area DA2_C2 is disposed between the first and fourth edge display areas DA2_E1 and DA2_E4. In addition, the third corner display area DA2_C3 is disposed between the second and third edge display areas DA2_E2 and DA2_E3, and the fourth corner display area DA2_C4 is disposed between the second and fourth edge display areas DA2_E2 and DA2_E4. The first to fourth corner display areas DA2_C1, DA2_C2, DA2_C3, and DA2_C4 may be areas in which an image is substantially displayed. However, the present disclosure is not limited thereto. That is, as another example, the first to fourth corner display areas DA2_C1, DA2_C2, DA2_C3, and DA2_C4 may be areas that do not display an image, or only some of them may display an image.

The display panel DP may include pixels disposed in the first display area DA1 and in the second display area DA2. Here, pixels disposed in the first display area DA1 are referred to as first pixels, and pixels disposed in the second display area DA2 are referred to as second pixels. Each of the first pixels may include a first light emitting element and a first pixel driving circuit connected to the first light emitting element, and each of the second pixels may include a second light emitting element and a second pixel driving circuit connected to the second light emitting element.

The display panel DP may further include gate drivers. The gate drivers may include a first gate driver GDC1 and a second gate driver GDC2. Each of the first and second gate drivers GDC1 and GDC2 may generate a plurality of scan signals and a plurality of emission control signals, and may output the generated signals to corresponding pixels.

The display panel DP may further include a non-display area around the second display area DA2. The non-display area is an area in which no image is displayed. The non-display area may surround the second display area DA2.

Each of the first and second gate drivers GDC1 and GDC2 may be disposed in the second display area DA2 or may be disposed to partially overlap the second display area DA2. As each of the first and second gate drivers GDC1 and GDC2 is disposed in the second display area DA2, the width of the non-display area may be prevented from being increased by the first and second gate drivers GDC1 and GDC2. As a result, the area of the non-display area recognized by the user in the display device DD may be reduced by disposing the first and second gate drivers GDC1 and GDC2 in the second display area DA2.

As depicted in FIG. 2B, the first gate driver GDC1 is disposed to be adjacent to an outer side of the third edge display area DA2_E3, and the second gate driver GDC2 is disposed to be adjacent to an outer side of the fourth edge display area DA2_E4. In addition, the first gate driver GDC1 is disposed to be adjacent to outer sides of the first and third corner display areas DA2_C1 and DA2_C3, and the second gate driver GDC2 is disposed to be adjacent to outer sides of the second and fourth corner display areas DA2_C2 and DA2_C4. However, the positions of the first and second gate drivers GDC1 and GDC2 are not limited thereto. For example, the first gate driver GDC1 may be disposed adjacent to the boundary with the first display area DA1 in the first and third corner display areas DA2_C1 and DA2_C3, and the second gate driver GDC2 may be disposed adjacent to the boundary with the first display area DA1 in the second and fourth corner display areas DA2_C2 and DA2_C4.

The bending stress may increase in the first to fourth corner display areas DA2_C1, DA2_C2, DA2_C3, and DA2_C4 toward the outside based on the first display area DA1. When the first and second gate drivers GDC1 and GDC2 are disposed adjacent to the outer side in the first to fourth corner display areas DA2_C1, DA2_C2, DA2_C3, and DA2_C4, the bending stress may affect the operation of the first and second gate drivers GDC1 and GDC2. Accordingly, by disposing the first and second gate drivers GDC1 and GDC2 adjacent to the first display area DA1 in the first to fourth corner display areas DA2_C1, DA2_C2, DA2_C3, and DA2_C4, reliability degradation of the first and second gate drivers GDC1 and GDC2 due to the bending stress can be prevented.

In an embodiment of the present disclosure, the first image displayed on the first display area DA1 and the second image displayed on the second display area DA2 may be dependent on each other. For example, a picture, a scene of a movie, or a UX/UI design may be formed by a combination of the first image and the second image. However, the present disclosure is not limited thereto. For example, some of the second display areas DA2, for example, the first to fourth corner display areas DA2_C1, DA2_C2, DA2_C3, and DA2_C4, may display a black image or a predetermined pattern image, which is not dependent on the first image.

As an example of the present disclosure, the display panel DP may be an organic light emitting display panel, an electrophoretic display panel, or an electrowetting display panel. In addition, the display panel DP may be a flexible display panel that can be bent along the shape of the window WM.

Referring back to FIG. 2A, the display panel DP may further include a pad area PP extending outward from the second display area DA2. A driving chip D-IC and pads may be disposed in the pad area PP of the display panel DP. The driving chip D-IC may provide driving signals to the first and second display areas DA1 and DA2 of the display panel DP. The driving chip D-IC may be mounted on the display panel DP. The display panel DP may be electrically connected to the flexible circuit film FCB through the pads. In an embodiment of the present disclosure, the driving chip D-IC may be mounted on the flexible circuit film FCB.

The housing HU includes a bottom part BP and a side wall SW. The side wall SW may extend from the bottom part BP. The housing HU may accommodate the display panel DP in an accommodation space defined by the bottom part BP and the side wall SW. The window WM may be coupled to the side wall SW of the housing HU. The side wall SW of the housing HU may support the edge of the window WM.

The housing HU may include a material having relatively high rigidity. For example, the housing HU may include a plurality of frames and/or plates made of glass, plastic, or metal, or a combination thereof. The housing HU may stably protect components of the display device DD accommodated in the internal space from external impact.

Figure 3A:
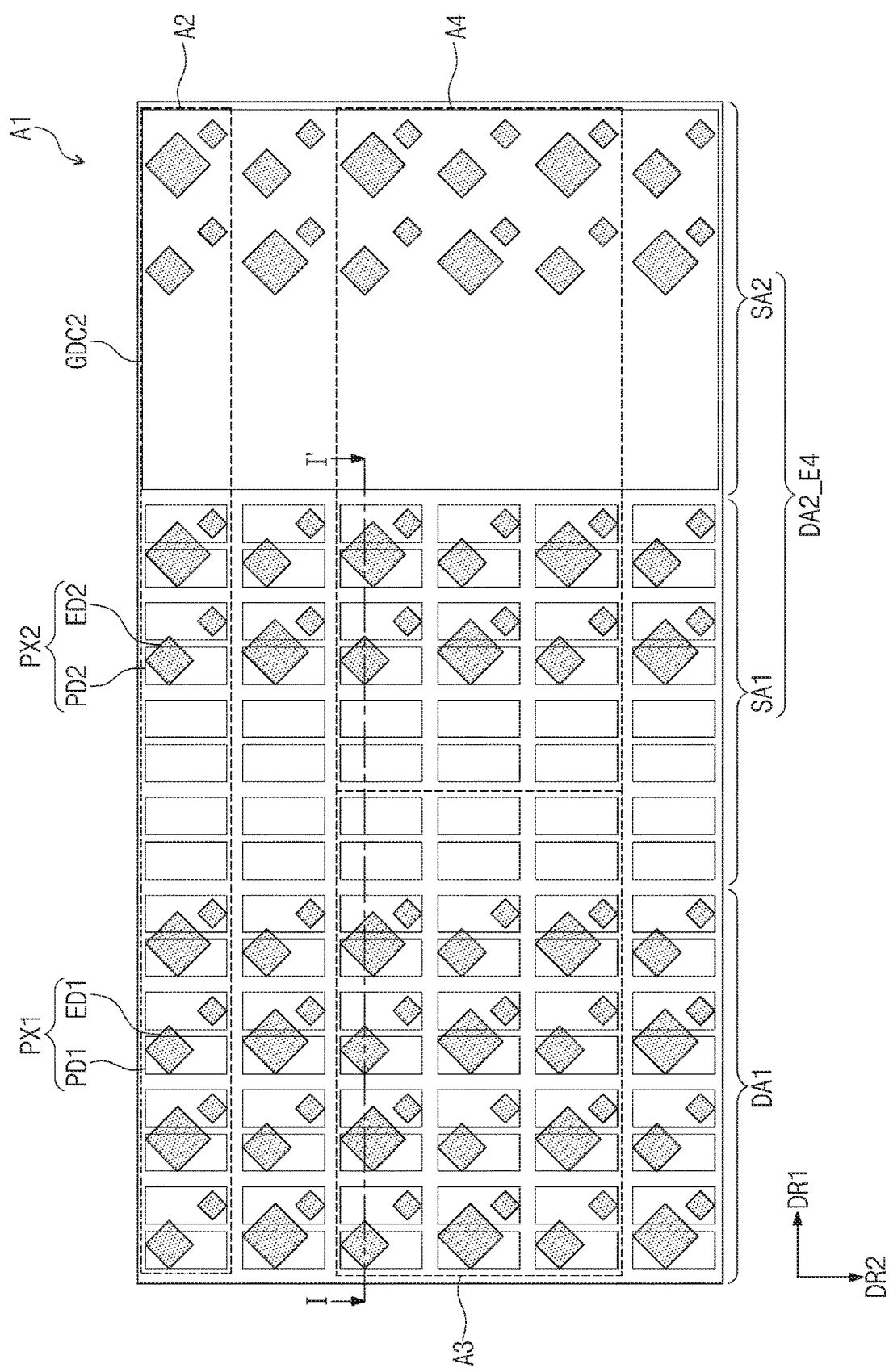
FIG. 3A is an enlarged plan view of an area A1 shown in FIG. 2B according to an embodiment.
Figure 3B:
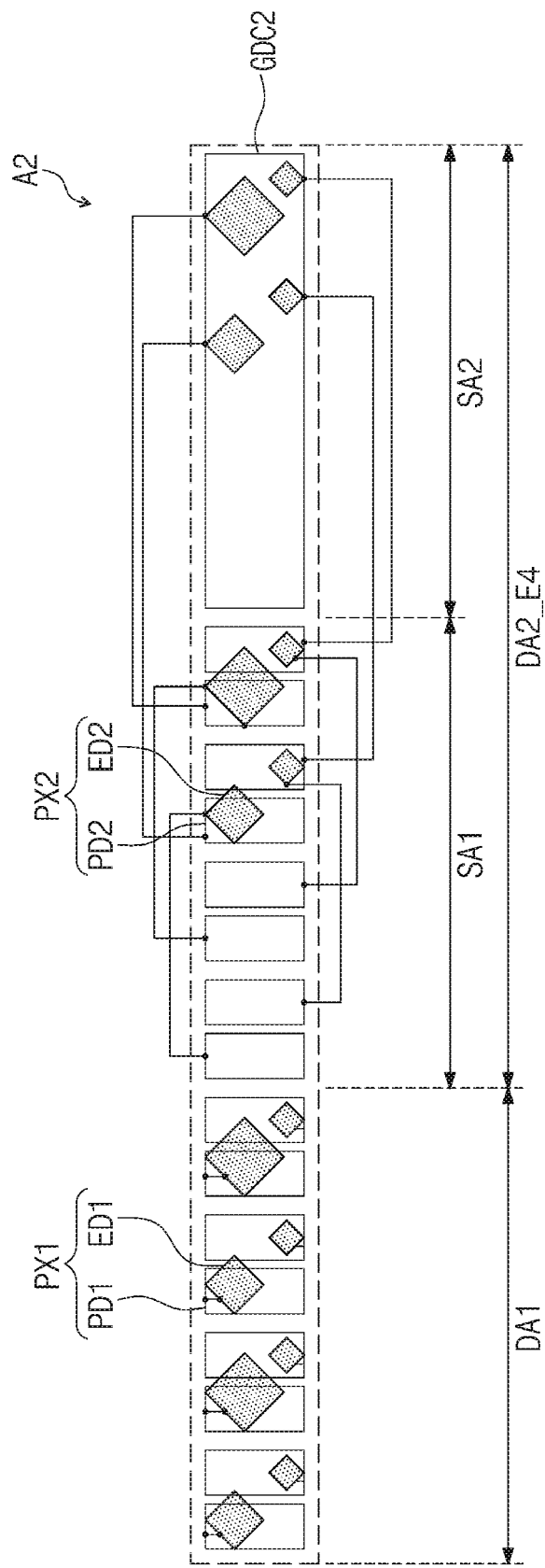
FIG. 3B is a diagram illustrating a connection relationship between light emitting elements in an area A2 and pixel driving circuits shown in FIG. 3A.

FIG. 3A is an enlarged plan view of an area A1 shown in FIG. 2B according to an embodiment, and FIG. 3B is a diagram illustrating a connection relationship between light emitting elements in an area A2 shown in FIG. 3A and pixel driving circuits.

Referring to FIGS. 3A and 3B, first pixels PX1 are disposed in the first display area DA1 of the display panel DP. The first pixels PX1 may include a plurality of first red pixels, a plurality of first green pixels, and a plurality of first blue pixels. Each of the first pixels PX1 includes a first pixel driving circuit PD1 and a first light emitting element ED1. The first pixel driving circuit PD1 is electrically connected to the first light emitting element ED1 to control driving of the first light emitting element ED1. In the first display area DA1, the first pixel driving circuit PD1 may be disposed to overlap the first light emitting element ED1.

The fourth edge display area DA2_E4 of the second display area DA2 may include first and second sub areas SA1 and SA2. FIGS. 3A and 3B show only the fourth edge display area DA2_E4 of the second display area DA2, but the first to third edge display areas DA2_E1, DA2_E2, and DA2_E3 and the first to fourth corner display areas DA2_C1, DA2_C2, DA2_C3, and DA2_C4 of the second display area DA2 have a structure similar to that of the fourth edge display area DA2_E4. Accordingly, in FIGS. 3A and 3B, the fourth edge display area DA2_E4 will be described, and descriptions of the remaining areas of the second display area DA2 will be omitted. However, for convenience of explanation, the fourth edge display area DA2_E4 will be described below by denoting it as the second display area DA2.

Second pixels PX2 are disposed in the second display area DA2 of the display panel DP. The second pixels PX2 may include a plurality of second red pixels, a plurality of second green pixels, and a plurality of second blue pixels. Each of the second pixels PX2 includes a second pixel driving circuit PD2 and a second light emitting element ED2. The second pixel driving circuit PD2 is electrically connected to the second light emitting element ED2 to control driving of the second light emitting element ED2. In the second display area DA2, the second pixel driving circuit PD2 may not be disposed to overlap the second light emitting element ED2.

The second display area DA2 may include the first sub area SA1 and the second sub area SA2. The second pixel driving circuits PD2 of the second pixels PX2 are disposed in the first sub area SA1, and the second light emitting elements ED2 of the second pixels PX2 are disposed in the first and second sub areas SA1 and SA2. The second gate driver GDC2 (or the first gate driver GDC1 illustrated in FIG. 2B) may be disposed in the second sub area SA2. The second pixel driving circuits PD2 do not overlap the second gate driver GDC2 (or the first gate driver GDC1).

Some of the second light emitting elements ED2 of the second pixels PX2 are disposed in the first sub area SA1, and some of the second light emitting elements ED2 of the second pixels PX2 is disposed in the second sub area SA2. Hereinafter, the second light emitting elements ED2 disposed in the first sub area SA1 is referred to as a first group of the second light emitting elements ED2, and the second light emitting elements ED2 disposed in the second sub area SA2 is referred to as a second group of second light emitting elements ED2. The first group of the second light emitting elements ED2 is disposed on the second pixel driving circuits PD2 in the first sub area SA1, and the second group of the second light emitting elements ED2 is disposed on the second gate driver GDC2 (or the first gate driver GDC1) in the second sub area SA2. Accordingly, each of the second light emitting elements ED2 of the second group may not overlap the electrically connected second pixel driving circuit PD2.

As shown in FIGS. 3A and 3B, when comparing the first light emitting element ED1 and the second light emitting element ED2 outputting the same color, they may have the same size and shape. However, the number of second pixels PX2 disposed per unit area in the second display area DA2 may be less than or equal to the number of first pixels PX1 disposed per unit area in the first display area DA1. Here, the unit area may be defined as a size that covers at least four or more pixels. In FIG. 3A, as an example of the present disclosure, it is shown that the number of second pixels PX2 disposed per unit area in the second display area DA2 is reduced by ½ times the number of first pixels PX1 disposed per unit area in the first display area DA1. However, the present disclosure is not limited thereto. For example, the number of second pixels PX2 disposed per unit area in the second display area DA2 may be reduced by ¼ or ⅛ times the number of first pixels PX1 disposed per unit area in the first display area DA1. Here, the unit area may refer to a size that covers at least 8 or 16 or more pixels.

Figure 4B:
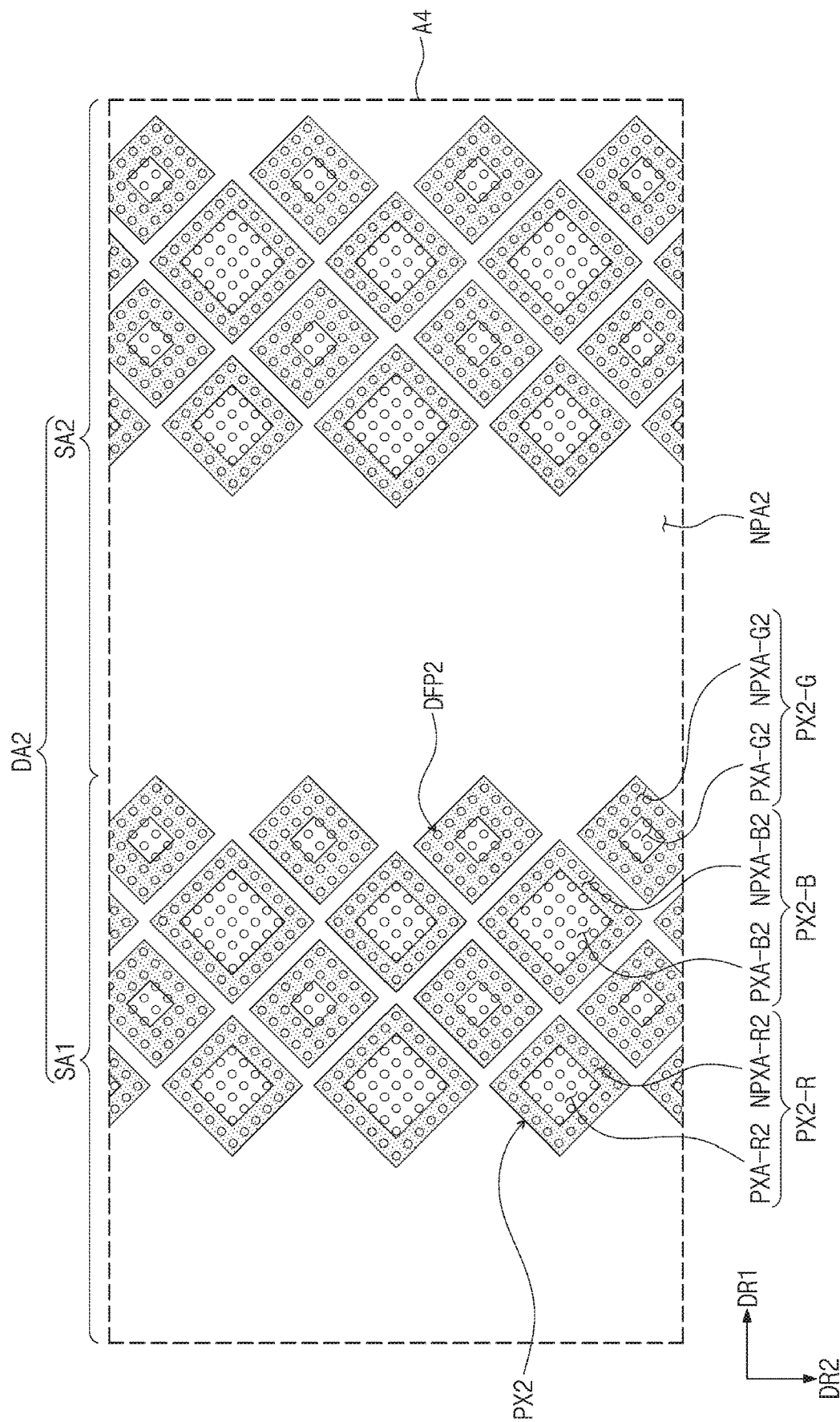
FIG. 4B is a plan view illustrating a relationship between a diffraction pattern layer and second pixels in an area A4 shown in FIG. 3A.
Figure 5A:
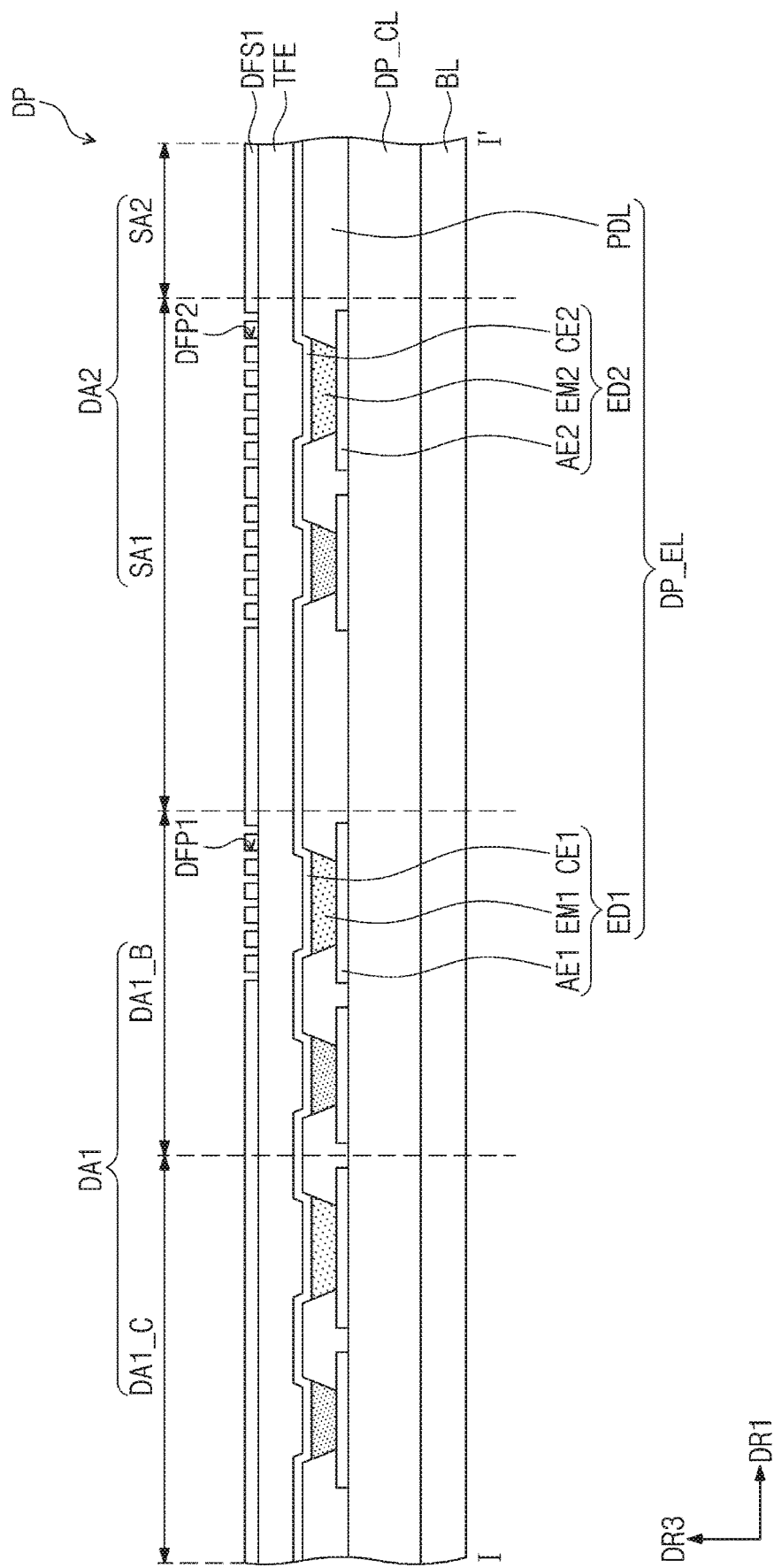
FIG. 5A is a cross-sectional view of the display panel according to an embodiment cut along the cutting line I-I' shown in FIG. 3A.
Figure 5B:
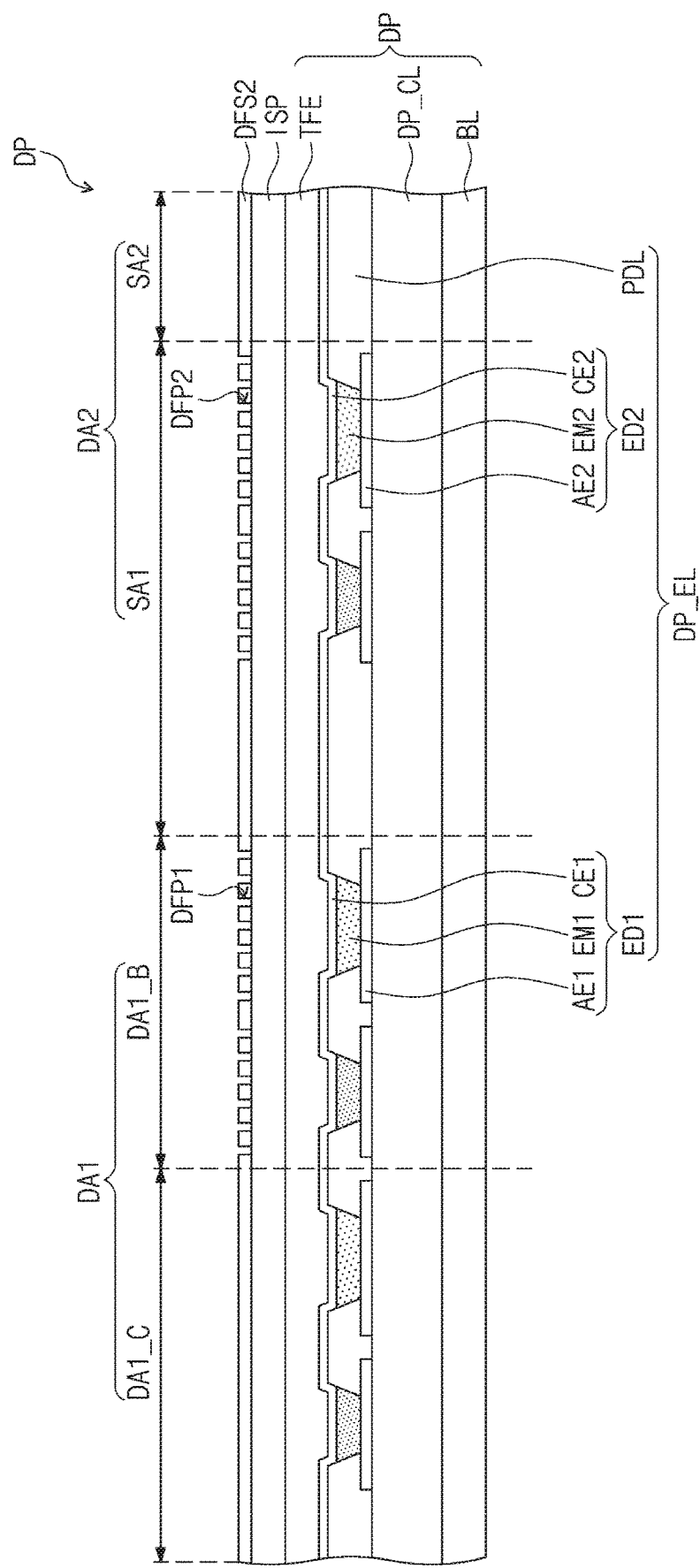
FIG. 5B is a cross-sectional view of a display device according to an embodiment of the present disclosure.

FIG. 4A is a plan view showing a relationship between a diffraction pattern layer and first pixels in an area A3 shown in FIG. 3A, and FIG. 4B is a plan view illustrating a relationship between a diffraction pattern layer and second pixels in an area A4 shown in FIG. 3A. FIG. 5A is a cross-sectional view of the display panel cut along the cutting line I-I' shown in FIG. 3A. FIG. 5B is a cross-sectional view of a display device according to an embodiment of the present disclosure.

Referring to FIGS. 4A and 5A, the first pixels PX1 are disposed in the first display area DA1 of the display panel DP. The first pixels PX1 may include a plurality of first red pixels PX1-R, a plurality of first green pixels PX1-G, and a plurality of first blue pixels PX1-B. The first red pixels PX1-R may be pixels that output red light, the first green pixels PX1-G may be pixels that output green light, and the first blue pixels PX1-B may be pixels that output blue light.

The first red pixels PX1-R, the first green pixels PX1-G, and the first blue pixels PX1-B may have different sizes from each other. As an example of the present disclosure, the first green pixels PX1-G have a size smaller than that of the first red pixels PX1-R and the first blue pixels PX1-B, and the first red pixels PX1-R may have a size smaller than that of the first blue pixels PX1-B.

The first red pixels PX1-R, the first green pixels PX1-G, and the first blue pixels PX1-B may be arranged along the first and second directions DR1 and DR2. The first red pixels PX1-R and the first blue pixels PX1-B may be alternately repeated and may be arranged along the first and second directions DR1 and DR2. A first non-pixel area NPA1 may be provided between the first red pixels PX1-R, the first green pixels PX1-G, and the first blue pixels PX1-B.

The arrangement structure of the first red pixels PX1-R, the first green pixels PX1-G, and the first blue pixels PX1-B shown in FIG. 4A is only illustrated as an example, and the present disclosure is not limited thereto. For example, according to another embodiment of the present disclosure, the first red pixels PX1-R, the first green pixels PX1-G, and the first blue pixels PX1-B may be arranged alternately along the second direction DR2. In addition, for example, it is shown that each of the first red pixels PX1-R, the first green pixels PX1-G, and the first blue pixels PX1-B has a rectangular shape, but is not limited thereto. Each of the first red pixels PX1-R, the first green pixels PX1-G, and the first blue pixels PX1-B may be variously deformed into polygons, circles, ellipses, and the like. As another example, shapes of the first red pixels PX1-R, the first green pixels PX1-G, and the first blue pixels PX1-B may be different from each other. That is, the first green pixels PX1-G may have a hexagonal or octagonal shape, and the first red pixels PX1-R and the first blue pixels PX1-B may have a rectangular shape or vice versa.

In addition, it is shown in FIG. 4A that the sizes of the first green pixels PX1-G are smaller than the sizes of the first red pixels PX1-R and the first blue pixels PX1-B but the present disclosure is not limited thereto. For example, in another embodiment of the present disclosure, the first red pixels PX1-R, the first green pixels PX1-G, and the first blue pixels PX1-B may have the same size.

Each of the first red pixels PX1-R includes a first emission area PXA-R1 from which light is outputted and a first non-emission area NPXA-R1 formed around the first emission area PXA-R1. Each of the first green pixels PX1-G includes a second emission area PXA-G1 from which light is outputted and a second non-emission area NPXA-G1 formed around the second emission area PXA-G1. Each of the first blue pixels PX1-B includes a third emission area PXA-B1 from which light is outputted and a third non-emission area NPXA-B1 formed around the third emission area PXA-B1. The first to third non-emission areas NPXA-R1, NPXA-G1, and NPXA-B1 are defined as areas in which light is not outputted.

As shown in FIG. 4B, second pixels PX2 are disposed in the second display area DA2 of the display panel DP. The second pixels PX2 may include a plurality of second red pixels PX2-R, a plurality of second green pixels PX2-G, and a plurality of second blue pixels PX2-B. The second red pixels PX2-R may be pixels that output red light, the second green pixels PX2-G may be pixels that output green light, and the second blue pixels PX2-B may be pixels that output blue light.

The second red pixels PX2-R, the second green pixels PX2-G, and the second blue pixels PX2-B may have different sizes. As an example of the present disclosure, the second red pixels PX2-R may have the same size as the first red pixels PX1-R, the second green pixels PX2-G may have the same size as the first green pixels PX1_G, and the second blue pixels PX2-B may have the same size as the first blue pixels PX1-B.

Each of the second red pixels PX2-R includes a fourth emission area PXA-R2 from which light is outputted and a fourth non-emission area NPXA-R2 formed around the fourth emission area PXA-R2. Each of the second green pixels PX2-G includes a fifth emission area PXA-G2 from which light is outputted and a fifth non-emission area NPXA-G2 formed around the fifth emission area PXA-G2. Each of the second blue pixels PX2-B includes a sixth emission area PXA-B2 from which light is outputted and a sixth non-emission area NPXA-B2 formed around the sixth emission area PXA-B2. The fourth, fifth, and sixth non-emission areas NPXA-R2, NPXA-G2, and NPXA-B2 are defined as areas in which light is not outputted. A second non-pixel area NPA2 may be provided between the second red pixels PX2-R, the second green pixels PX2-G, and the second blue pixels PX2-B.

An area occupied by the second non-pixel area NPA2 per unit area in the second display area DA2 may be larger than an area occupied by the first non-pixel area NPA1 per unit area in the first display area DA1. For example, the number of second pixels PX2 disposed per unit area in the second display area DA2 is reduced by ½ times the number of the first pixels PX1 disposed per unit area in the first display area DA1, the area of the second non-pixel area NPA2 per unit area may be two or more times larger than the area of the first non-pixel area NPA1 per unit area. Here, the unit area may refer to a size that covers at least 8 or 16 or more pixels.

Referring back to FIG. 4A, the first display area DA1 may include a boundary area DA1_B adjacent to the second display area DA2 and a center area DA1_C disposed adjacent to the boundary area DA1_B. Hereinafter, for convenience of description, the first pixels PX1 located in the boundary area DA1_B are referred to as boundary pixels PX1_BD, and the first pixels PX1 located in the center area DA1_C are referred to as center pixels PX1_C. That is, the boundary pixels PX1_BD may be defined as first pixels PX1 adjacent to the second display area DA2 than the center pixels PX1_C.

Referring to FIGS. 3A, 3B, 4A, 4B, and 5A, the display panel DP includes a base layer BL, a circuit element layer DP_CL disposed on the base layer BL, and a display element layer DP_EL disposed on the circuit element layer DP_CL.

The base layer BL may include a synthetic resin layer. The synthetic resin layer is formed on a working substrate used in manufacturing the display panel DP. Thereafter, a conductive layer and an insulating layer are formed on the synthetic resin layer. When the working substrate is removed, the synthetic resin layer corresponds to the base layer BL. The synthetic resin layer may be a polyimide resin layer, and the material thereof is not particularly limited. In addition, the base layer BL may include a glass substrate, a metal substrate, or an organic/inorganic composite material substrate.

The circuit element layer DP_CL may be defined as a layer on which the first and second pixel driving circuits PD1 and PD2 and the first and second gate drivers GDC1 and GDC2 shown in FIG. 2B are disposed. That is, the first and second gate drivers GDC1 and GDC2 may be disposed on the same layer as the first and second pixel driving circuits PD1 and PD2.

The circuit element layer DP_CL may include at least one insulating layer. The insulating layer included in the circuit element layer DP_CL is referred to as an intermediate insulating layer. The intermediate insulating layer includes at least one intermediate inorganic layer and at least one intermediate organic layer. The circuit element layer DP_CL further includes signal lines supplying various signals to the first and second pixel driving circuits PD1 and PD2 and the first and second gate drivers GDC1 and GDC2. The circuit element layer DP_CL may be formed through a process of forming an insulating layer, a semiconductor layer, and a conductive layer through coating or deposition, and a patterning process of an insulating layer, a semiconductor layer, and a conductive layer through a photolithography process.

The display element layer DP_EL includes first light emitting elements ED1 and second light emitting elements ED2. The display element layer DP_EL may overlap the first and second gate drivers GDC1 and GCD2. Specifically, some of the second light emitting elements ED2 disposed on the display element layer DP_EL may overlap the first and second gate drivers GDC1 and GDC2. Accordingly, an image may be displayed by the second light emitting elements ED2 even in the second sub area SA2 in which the first and second gate drivers GDC1 and GDC2 are disposed in the second display area DA2.

Each of the first light emitting elements ED1 includes a first anode electrode AE1, a first emission layer EM1, and a first cathode electrode CE1, and each of the second light emitting elements ED2 includes a second anode electrode AE2, a second emission layer EM2, and a second cathode electrode CE2. As an example of the present disclosure, the first cathode electrode CE1 and the second cathode electrode CE2 may be electrically connected. That is, the first and second cathode electrodes CE1 and CE2 may be integrally formed to be provided in the form of one whole electrode.

The first emission layer EM1 may be formed separately from each of the first pixels PX1-R, PX1-G, and PX1-B. The first emission layer EM1 may include an organic material and/or an inorganic material. The first emission layer EM1 may generate predetermined colored light. For example, the first emission layer EM1 may generate at least one of red light, green light, and blue light. Although the first emission layer EM1 patterned in this embodiment is illustrated as an example, the first emission layer EM1 may be commonly disposed in the first to third emission regions PXA-R1, PXA-G1, and PXA-B1. In this case, the first emission layer EM1 may generate white light or blue light.

The second emission layer EM2 may be separately formed on each of the second pixels PX2-R, PX2-G, and PX2-B. The second emission layer EM2 may include an organic material and/or an inorganic material. The second emission layer EM2 may generate predetermined colored light. For example, the second emission layer EM2 may generate at least one of red light, green light, and blue light. Although the second emission layer EM2 patterned in this embodiment is illustrated as an example, the second emission layer EM2 may be commonly disposed in the fourth, fifth, and sixth emission regions PXA-R2, PXA-G2, and PXA-B2. In this case, the second emission layer EM2 may generate white light or blue light.

The display element layer DP_EL may further include a pixel definition layer PDL. The pixel definition layer PDL may include an organic material. An opening part is defined in the pixel definition layer PDL. The opening part of the pixel definition layer PDL exposes at least a portion of the first and second anode electrodes AE1 and AE2. In an embodiment of the present disclosure, the pixel definition layer PDL may be omitted.

The display panel DP further includes an encapsulating layer TFE disposed on the first and second cathode electrodes CE1 and CE2. The encapsulating layer TFE seals the display element layer DP_EL. The encapsulating layer TFE includes at least one insulating layer. The encapsulating layer TFE according to an embodiment of the present disclosure may include at least one inorganic film and/or at least one organic film. The encapsulating layer TFE protects the display element layer DP_EL from moisture/oxygen and protects the display element layer DP_EL from foreign substances such as dust particles.

The display panel DP further includes a diffraction pattern layer DFS1 disposed on the encapsulating layer TFE. The diffraction pattern layer DFS1 may include an insulating material having a predetermined refractive index. As an example of the present disclosure, the diffraction pattern layer DFS1 may include an inorganic material or an organic material. The diffraction pattern layer DFS1 may include a plurality of second diffraction patterns DFP2 disposed on the second pixels PX2 in the second display area DA2. The plurality of second diffraction patterns DFP2 are arranged to have a constant period, and diffract at least part of the light outputted from the second light emitting elements ED2. As an example of the present disclosure, each of the second diffraction patterns DFP2 may define a hole penetrating through the diffraction pattern layer DFS1 as shown in FIG. 5A. That is, each of the second diffraction patterns DFP2 is formed through the diffraction pattern layer DFS1 in the third direction DR3. The encapsulating layer TFE may be partially exposed by the second diffraction patterns DFP2.

Each of the second diffraction patterns DFP2 may have a circular shape when viewed on a plane. Also, the plurality of second diffraction patterns DFP2 may be arranged in a matrix form. However, the shape of the second diffraction patterns DFP2 is not limited to the circular shape. That is, the second diffraction patterns DFP2 may have any one of an ellipse, a polygon, and a stripe shape.

The second diffraction patterns DFP2 may overlap the fourth, fifth, and sixth emission areas PXA-R2, PXA-G2, and PXA-B2. The second diffraction patterns DFP2 may also partially overlap the non-emission areas NPXA-R2, NPXA-G2, and NPXA-B2. The second diffraction patterns DFP2 may not overlap the second non-pixel area NPA2.

The front light of the light generated from the second light emitting element ED2 may pass through the second diffraction patterns DFP2 to display the front pixel image. The side light of the light generated from the second light emitting element ED2 is diffracted by the second diffraction patterns DFP2. The side light of the light generated from the second light emitting element ED2 may display duplicate pixel images. The duplicate pixel images may be arranged to surround the front pixel image. In the second display area DA2, some of the duplicate pixel images may be displayed in the second non-pixel area NPA2. When defining the separation distance between the front pixel image and the duplicate pixel images as the duplication period, the duplication period may vary depending on the distance between the second diffraction patterns DFP2 and the second light emitting element ED2, the arrangement period of the second diffraction patterns DFP2, and the like.

As the duplicate pixel image is displayed in the second non-pixel area NPA2 of the second display area DA2, the total luminance of the second display area DA2 increases, and as a result, a luminance difference or a color coordinate difference between the first and second display areas DA1 and DA2 may be compensated. In particular, as a duplicate pixel image is displayed in the second non-pixel area NPA2, a phenomenon in which the second non-pixel area NPA2 is visually recognized as a dark line may be eliminated (or reduced), and as a result, the overall image quality of the display device DD may be improved.

The diffraction pattern layer DFS1 may further include a plurality of first diffraction patterns DFP1 disposed on the boundary pixels PX1_BD in the boundary area DA1_B among the first pixels PX1. The plurality of first diffraction patterns DFP1 are arranged to have a certain period, and diffract at least a part of light outputted from the first light emitting element ED1 of the boundary pixel PX1_BD. As an example of the present disclosure, each of the first diffraction patterns DFP1 may define a hole penetrating through the diffraction pattern layer DFS1 as shown in FIG. 5A. That is, each of the first diffraction patterns DFP1 is formed through the diffraction pattern layer DFS1 in the third direction DR3. The encapsulating layer TFE may be partially exposed by the first diffraction patterns DFP1.

The front light of the light generated from the first light emitting element ED1 of the boundary pixels PX1_BD may pass through the first diffraction patterns DFP1 to display the front pixel image. The side light of the light generated from the first light emitting element ED1 of the boundary pixels PX1_BD is diffracted by the first diffraction patterns DFP1. The side light of the light generated from the first light emitting element ED1 of the boundary pixels PX1_BD may display duplicate pixel images. The duplicate pixel images may be arranged to surround the front pixel image. Some of the duplicate pixel images of the boundary pixels PX1_B may be displayed in the second non-pixel area NPA2.

As the duplicate pixel images of the second light emitting elements ED2 and the duplicate pixel images of the boundary pixels PX1_BD are displayed in the second non-pixel area NPA2 of the second display area DA2, a difference in luminance or a difference in color coordinates between the first and second display areas DA1 and DA2 may be compensated. In particular, a phenomenon in which the second non-pixel area NPA2 of the second display area DA2 is visually recognized as a dark line may be removed (or decreased), and as a result, the image quality in the second display area DA2 may be improved.

As shown in FIG. 5A, the diffraction pattern layer DFS1 may be directly disposed on the encapsulating layer TFE. That is, the diffraction pattern layer DFS1 may be formed on the encapsulating layer TFE by a continuous process. Although not shown in the drawing, an input detection layer may be further disposed on the diffraction pattern layer DFS1. The input detection layer may be directly disposed on the diffraction pattern layer DFS1. When the input detection layer is directly disposed on the diffraction pattern layer DFS1, the adhesive film is not disposed between the input detection layer and the diffraction pattern layer DFS1.

Referring to FIG. 5B, an input detection layer ISP is disposed on the display panel DP, and a diffraction pattern layer DFS2 is disposed on the input detection layer ISP. The input detection layer ISP may be disposed directly on the encapsulating layer TFE. The input detection layer ISP may be formed on the encapsulating layer TFE by a continuous process. In this case, the adhesive film is not disposed between the input detection layer ISP and the display panel DP.

The diffraction pattern layer DFS2 may be directly disposed on the input detection layer ISP. However, the present disclosure is not limited thereto. For example, one of a plurality of insulating layers constituting the input detection layer ISP may be used as the diffraction pattern layer DFS2.

Figure 6:
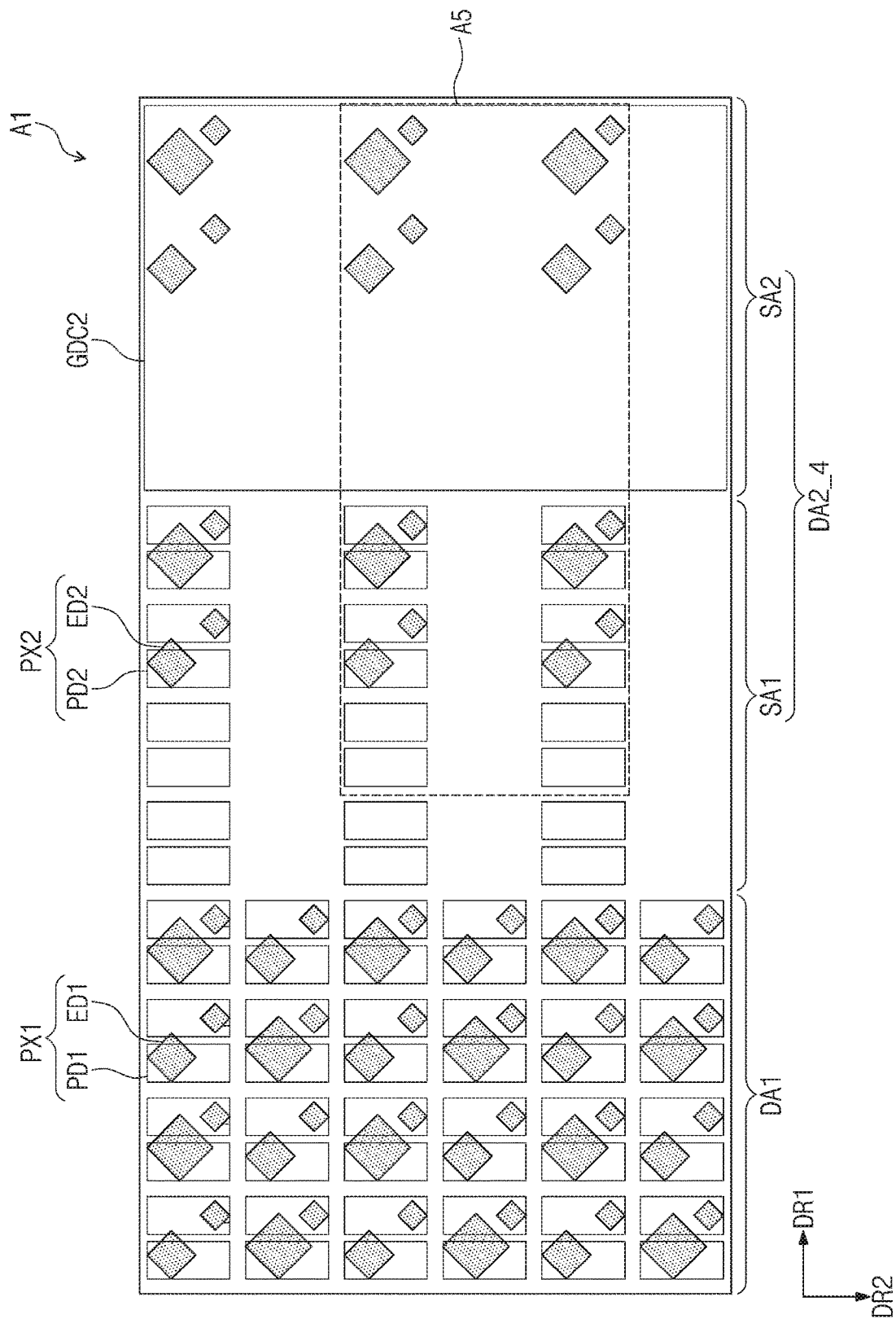
FIG. 6 is an enlarged plan view of an area A1 shown in FIG. 2B according to another embodiment.

FIG. 6 is an enlarged plan view of an area A1 shown in FIG. 2B according to another embodiment, and FIG. 7 is a plan view illustrating a relationship between a diffraction pattern layer and second pixels in an area A5 shown in FIG. 6. However, among the components shown in FIGS. 6 and 7, the same reference numerals are used for the same components as those shown in FIGS. 3A, 3B, 4A, and 4B, and descriptions thereof will be omitted.

Referring to FIGS. 5A, 6, and 7, the second pixels PX2 are disposed in the second display area DA2 of the display panel DP. The second pixels PX2 may include the plurality of second red pixels PX2-R, the plurality of second green pixels PX2-G, and the plurality of second blue pixels PX2-B.

The second red pixels PX2-R, the second green pixels PX2-G, and the second blue pixels PX2-B may have different sizes. As an example of the present disclosure, the second red pixels PX2-R may have the same size as the first red pixels PX1-R, the second green pixels PX2-G may have the same size as the first green pixels PX1-G, and the second blue pixels PX2-B may have the same size as the first blue pixels PX1-B.

Each of the second red pixels PX2-R includes a fourth emission area PXA-R2 from which light is outputted and a fourth non-emission area NPXA-R2 formed around the fourth emission area PXA-R2. Each of the second green pixels PX2-G includes a fifth emission area PXA-G2 from which light is outputted and a fifth non-emission area NPXA-G2 formed around the fifth emission area PXA-G2. Each of the second blue pixels PX2-B includes a sixth emission area PXA-B2 from which light is outputted and a sixth non-emission area NPXA-B2 formed around the sixth emission area PXA-B2. The fourth, fifth, and sixth non-emission areas NPXA-R2, NPXA-G2, and NPXA-B2 are defined as areas in which light is not outputted. A second non-pixel area NPA2a may be provided between the second red pixels PX2-R, the second green pixels PX2-G, and the second blue pixels PX2-B.

In FIGS. 6 and 7, as an example of the present disclosure, it is shown that the number of second pixels PX2 disposed per unit area in the second display area DA2 is reduced by ¼ times the number of first pixels PX1 disposed per unit area in the first display area DA1. However, the present disclosure is not limited thereto. For example, the number of second pixels PX2 disposed per unit area in the second display area DA2 may be reduced by ⅛ or 1/16 times the number of first pixels PX1 disposed per unit area in the first display area DA1. Here, the unit area may refer to a size that covers at least 8 or 16 or more pixels.

An area occupied by the second non-pixel area NPA2a per unit area in the second display area DA2 may be larger than an area occupied by the first non-pixel area NPA1 per unit area in the first display area DA1. For example, the number of second pixels PX2 disposed per unit area in the second display area DA2 is reduced by ¼ times the number of the first pixels PX1 disposed per unit area in the first display area DA1, the area of the second non-pixel area NPA2a per unit area may be larger than the area of the second non-pixel area NPA2 shown in FIG. 4B.

The display panel DP further includes a diffraction pattern layer DFS1 disposed on the encapsulating layer TFE. The diffraction pattern layer DFS1 may include an insulating material having a predetermined refractive index. The diffraction pattern layer DFS1 may include a plurality of second diffraction patterns DFP2 disposed on the second pixels PX2 in the second display area DA2. The plurality of second diffraction patterns DFP2 diffract at least part of the light outputted from the second light emitting elements ED2.

The front light of the light generated from the second light emitting element ED2 may transmit the second diffraction patterns DFP2 to display the front pixel image. The side light of the light generated from the second light emitting element ED2 is diffracted by the second diffraction patterns DFP2. The side light of the light generated from the second light emitting element ED2 may display duplicate pixel images. The duplicate pixel images may be arranged to surround the front pixel image. In the second display area DA2, some of the duplicate pixel images may be displayed in the second non-pixel area NPA2a.

As the duplicate pixel image is displayed in the second non-pixel area NPA2a of the second display area DA2, a difference in luminance or color coordinates between the first and second display areas DA1 and DA2 may be reduced. In particular, a phenomenon in which the second non-pixel area NPA2a of the second display area DA2 is visually recognized as a dark line may be removed (or decreased), and as a result, the image quality in the second display area DA2 may be improved.

The diffraction pattern layer DFS1 may further include a plurality of first diffraction patterns DFP1 disposed on the boundary pixels PX1_BD (refer to FIG. 4A) in the boundary area DA1_B among the first pixels PX1. The plurality of first diffraction patterns DFP1 diffract at least a part of light outputted from the first light emitting element ED1 of the boundary pixel PX1_BD.

The front light of the light generated from the first light emitting element ED1 of the boundary pixels PX1_BD may pass through the first diffraction patterns DFP1 to display the front pixel image. The side light of the light generated from the first light emitting element ED1 of the boundary pixels PX1_BD is diffracted by the first diffraction patterns DFP1. The side light of the light generated from the first light emitting element ED1 of the boundary pixels PX1_BD may display duplicate pixel images. The duplicate pixel images may be arranged to surround the front pixel image. Some of the duplicate pixel images of the boundary pixels PX1_BD may be displayed in the second non-pixel area NPA2a.

As the duplicate pixel images of the second light emitting elements ED2 and the duplicate pixel images of the boundary pixels PX1_BD are displayed in the second non-pixel area NPA2a of the second display area DA2, a difference in luminance or a difference in color coordinates between the first and second display areas DA1 and DA2 may be compensated. In particular, a phenomenon in which the second non-pixel area NPA2a of the second display area DA2 is visually recognized as a dark line may be removed (or decreased), and as a result, the image quality in the second display area DA2 may be improved.

Figure 8B:
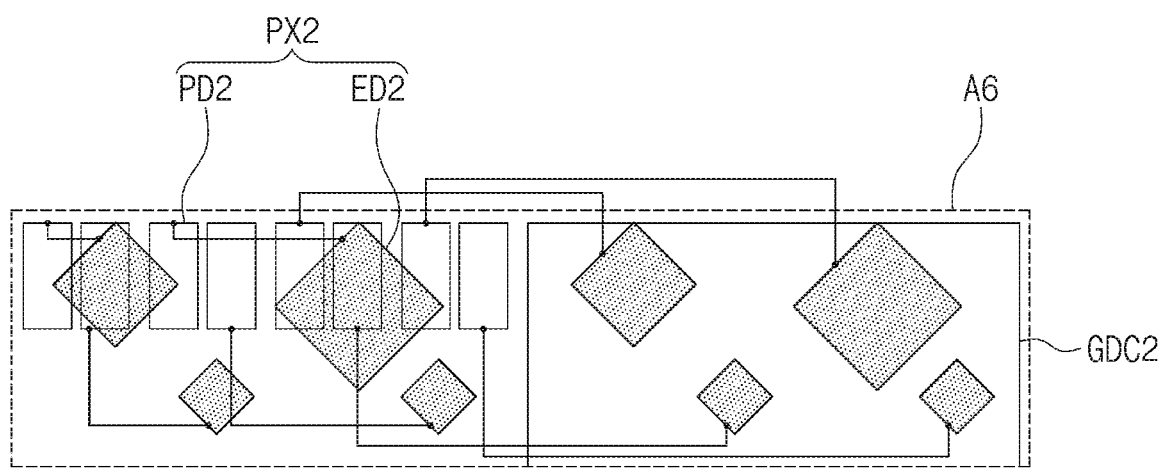
FIG. 8B is a diagram illustrating a connection relationship between second light emitting elements in an area A6 and second pixel driving circuits shown in FIG. 8A.
Figure 8C:
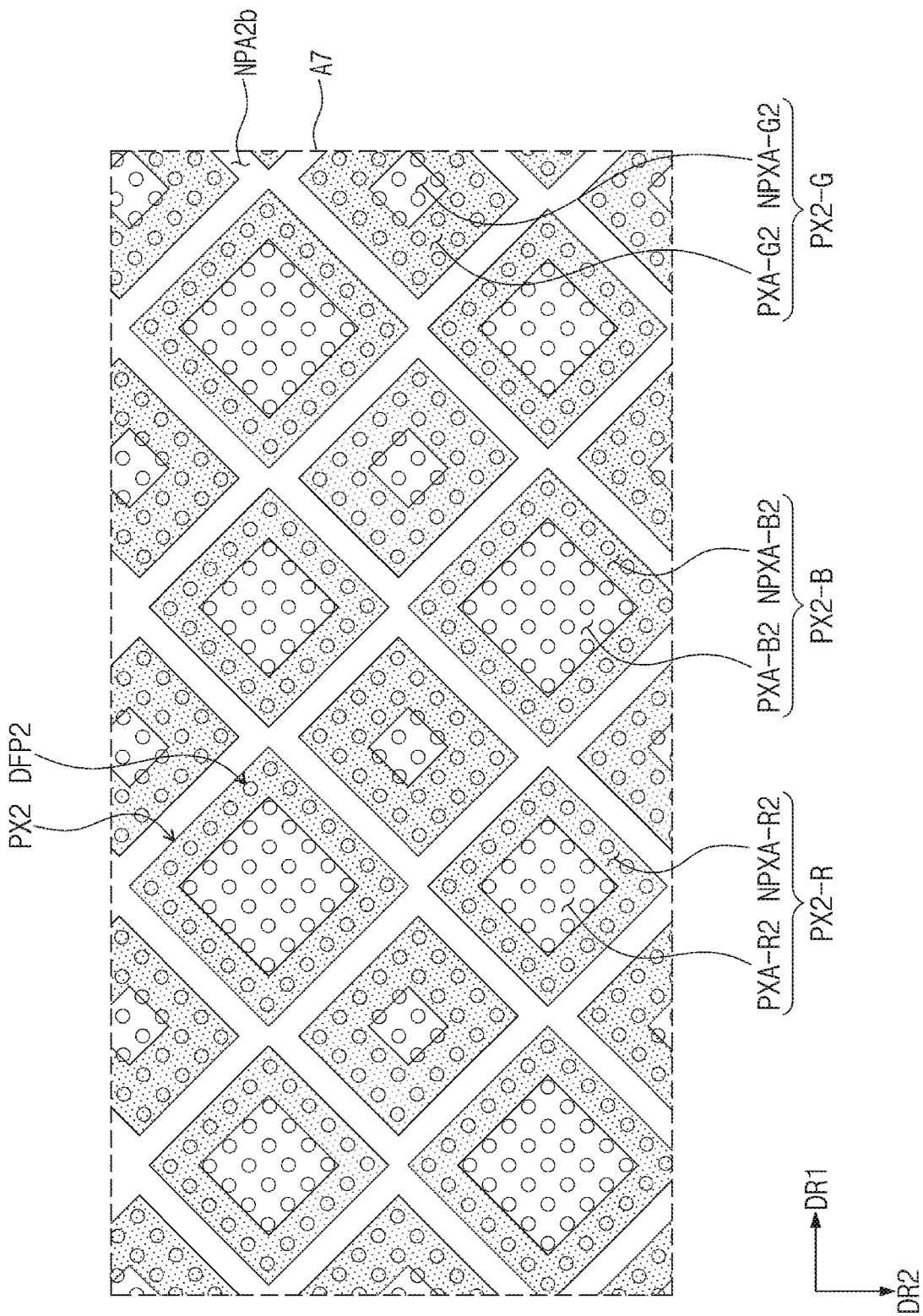
FIG. 8C is a plan view illustrating a relationship between a diffraction pattern layer and second pixels in an area A7 shown in FIG. 8A.
Figure 9A:
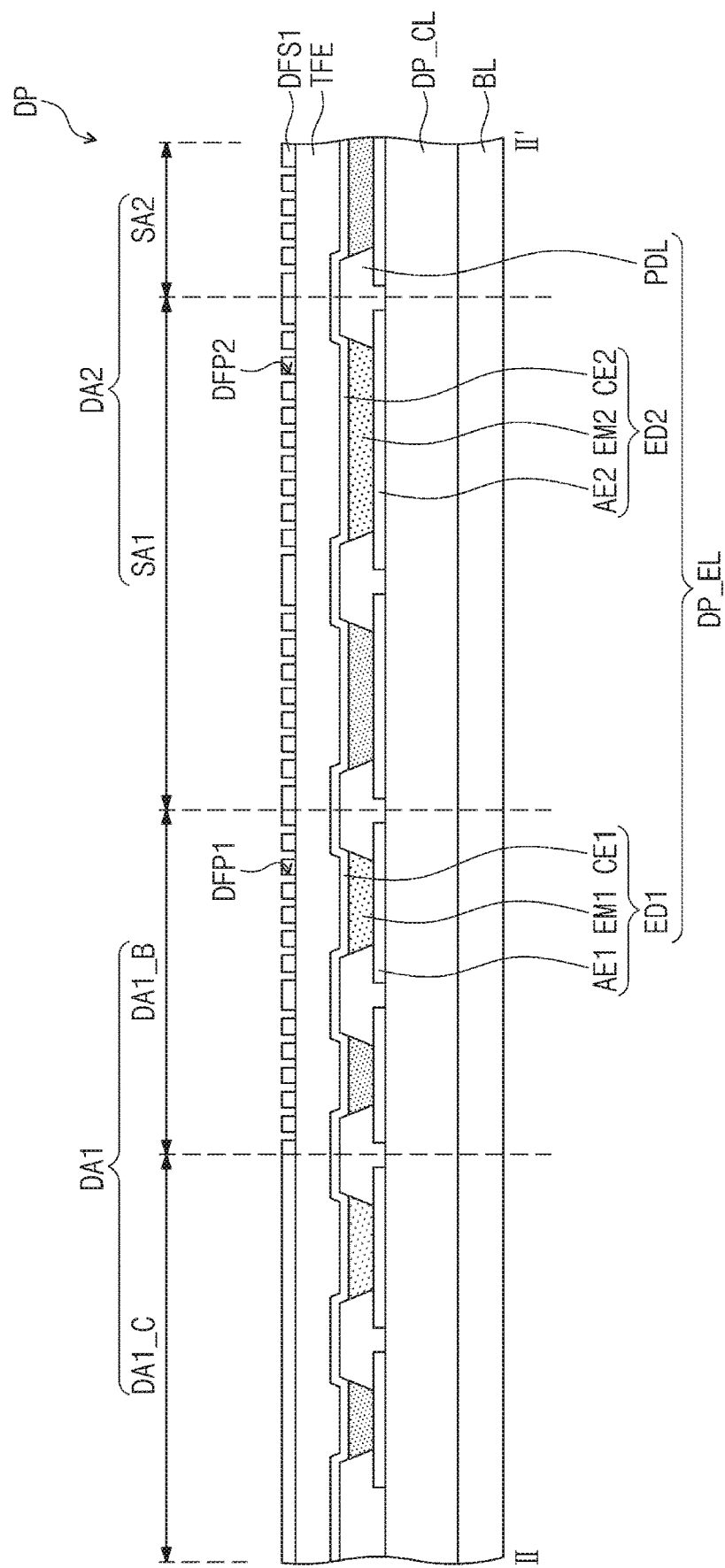
FIG. 9A is a cross-sectional view of the display panel cut along the cutting line II-II" shown in FIG. 8A.
Figure 9B:
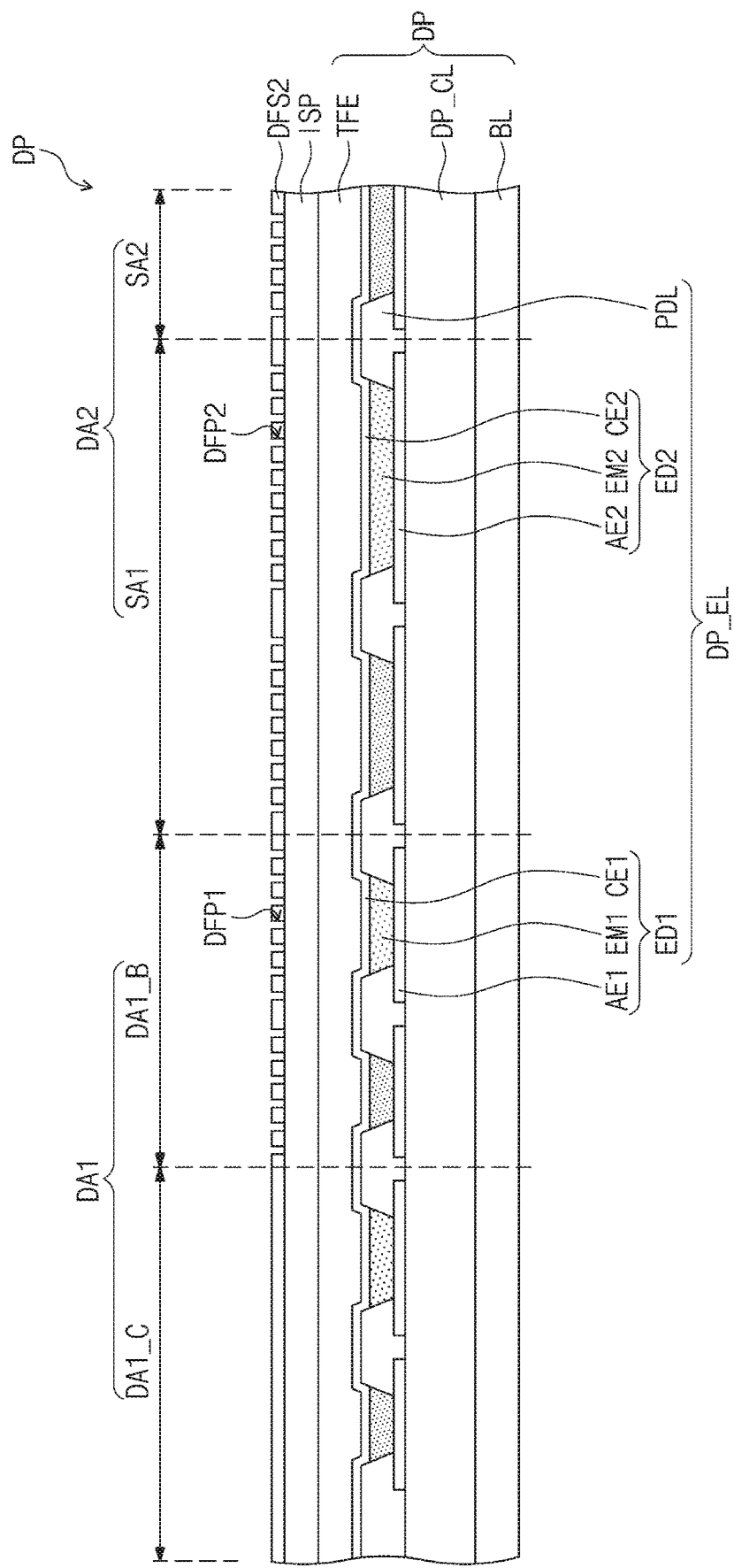
FIG. 9B is a cross-sectional view of a display device according to an embodiment of the present disclosure.

FIG. 8A is an enlarged plan view of an area A1 shown in FIG. 2B according to still another embodiment, and FIG. 8B is a diagram illustrating a connection relationship between second light emitting elements in an area A6 and second pixel driving circuits shown in FIG. 8A, and FIG. 8C is a plan view illustrating a relationship between a diffraction pattern layer and second pixels in an area A7 shown in FIG. 8A. FIG. 9A is a cross-sectional view of a display panel cut along a cutting line II-II" shown in FIG. 8A, and FIG. 9B is a cross-sectional view of a display device according to an embodiment of the present disclosure.

Referring to FIGS. 8A, 8B, 8C, and 9A, second pixels PX2 are disposed in the second display area DA2 of the display panel DP. The second pixels PX2 may include a plurality of second red pixels PX2-R, a plurality of second green pixels PX2-G, and a plurality of second blue pixels PX2-B.

The second red pixels PX2-R, the second green pixels PX2-G, and the second blue pixels PX2-B may have different sizes. As an example of the present disclosure, the second red pixels PX2-R have a larger size than the first red pixels PX1-R, the second green pixels PX2-G have a larger size than the first green pixels PX1-G, and the second blue pixels PX2-B have a larger size than the first blue pixels PX1-B. For example, the second red pixels PX2-R have a size that is 2 to 4 times larger than the first red pixels PX1-R, the second green pixels PX2-G have a size that is 2 to 4 times larger than the first green pixels PX1-G, and the second blue pixels PX2-B have a size that is 2 to 4 times larger than the first blue pixels PX1-B.

Each of the second red pixels PX2-R includes a fourth emission area PXA-R2 from which light is outputted and a fourth non-emission area NPXA-R2 formed around the fourth emission area PXA-R2. Each of the second green pixels PX2-G includes a fifth emission area PXA-G2 from which light is outputted and a fifth non-emission area NPXA-G2 formed around the fifth emission area PXA-G2. Each of the second blue pixels PX2-B includes a sixth emission area PXA-B2 from which light is outputted and a sixth non-emission area NPXA-B2 formed around the sixth emission area PXA-B2. The fourth, fifth, and sixth non-emission areas NPXA-R2, NPXA-G2, and NPXA-B2 are defined as areas in which light is not outputted. A second non-pixel area NPA2b may be provided between the second red pixels PX2-R, the second green pixels PX2-G, and the second blue pixels PX2-B.

As the sizes of the second red pixels PX2-R, the second green pixels PX2-G, and the second blue pixels PX2-B increase, the area of the second non-pixel area NPA2b per unit area may be reduced compared to the embodiments illustrated in FIGS. 4B and 7.

In FIGS. 8A and 8B, as an example of the present disclosure, it is shown that the number of second pixels PX2 disposed per unit area in the second display area DA2 is reduced by ¼ times the number of first pixels PX1 disposed per unit area in the first display area DA1. However, the present disclosure is not limited thereto. For example, the number of second pixels PX2 disposed per unit area in the second display area DA2 may be reduced by ⅛ or 1/16 times the number of first pixels PX1 disposed per unit area in the first display area DA1. Here, the unit area may refer to a size that covers at least 8 or 16 or more pixels.

An area occupied by the second non-pixel area NPA2b per unit area in the second display area DA2 may be larger than an area occupied by the first non-pixel area NPA1 per unit area in the first display area DA1. For example, the number of second pixels PX2 disposed per unit area in the second display area DA2 is reduced by ¼ times the number of the first pixels PX1 disposed per unit area in the first display area DA1, the area of the second non-pixel area NPA2b per unit area may be larger than the area of the first non-pixel area NPA1 per unit area.

The display panel DP further includes a diffraction pattern layer DFS1 disposed on the encapsulating layer TFE. The diffraction pattern layer DFS1 may include an insulating material having a predetermined refractive index. The diffraction pattern layer DFS1 may include a plurality of second diffraction patterns DFP2 disposed on the second pixels PX2 in the second display area DA2. The plurality of second diffraction patterns DFP2 diffract at least part of the light outputted from the second light emitting elements ED2.

The plurality of second diffraction patterns DFP2 may overlap the fourth to sixth emission areas PXA-R2, PXA-G2, and PXA-B2. The plurality of second diffraction patterns DFP2 may also partially overlap the non-emission areas NPXA-R2, NPXA-G2, and NPXA-B2. The plurality of second diffraction patterns DFP2 may not overlap the second non-pixel area NPA2b.

The front light of the light generated from the second light emitting element ED2 may pass through the second diffraction patterns DFP2 to display the front pixel image. The side light of the light generated from the second light emitting element ED2 is diffracted by the second diffraction patterns DFP2. The side light of the light generated from the second light emitting element ED2 may display duplicate pixel images. The duplicate pixel images may be arranged to surround the front pixel image. In the second display area DA2, some of the duplicate pixel images may be displayed in the second non-pixel area NPA2b.

As the duplicate pixel image is displayed in the second non-pixel area NPA2b of the second display area DA2, a difference in luminance or color coordinates between the first and second display areas DA1 and DA2 may be compensated. In particular, a phenomenon in which the second non-pixel area NPA2b of the second display area DA2 is visually recognized as a dark line may be removed (or decreased), and as a result, the image quality in the second display area DA2 may be improved.

The diffraction pattern layer DFS1 may further include a plurality of first diffraction patterns DFP1 disposed on the boundary pixels PX1_BD (refer to FIG. 4A) in the boundary area DA1_B among the first pixels PX1. The plurality of first diffraction patterns DFP1 diffract at least a part of light outputted from the first light emitting element ED1 of the boundary pixel PX1_BD.

The first diffraction patterns DFP1 may have the same size as the second diffraction patterns DFP2. However, the present disclosure is not limited thereto. The second diffraction patterns DFP2 may have a size that is 2 or 4 times the size of the first diffraction patterns DFP1.

The front light of the light generated from the first light emitting element ED1 of the boundary pixels PX1_BD may pass through the first diffraction patterns DFP1 to display the front pixel image. The side light of the light generated from the first light emitting element ED1 of the boundary pixels PX1_BD is diffracted by the first diffraction patterns DFP1. The side light of the light generated from the first light emitting element ED1 of the boundary pixels PX1_BD may display duplicate pixel images. The duplicate pixel images may be arranged to surround the front pixel image. Some of the duplicate pixel images of the boundary pixels PX1_BD may be displayed in the second non-pixel area NPA2b.

As the duplicate pixel images of the second light emitting elements ED2 and the duplicate pixel images of the boundary pixels PX1_BD are displayed in the second non-pixel area NPA2b of the second display area DA2, a difference in luminance or a difference in color coordinates between the first and second display areas DA1 and DA2 may be compensated. In particular, a phenomenon in which the second non-pixel area NPA2b of the second display area DA2 is visually recognized as a dark line may be removed (or decreased), and as a result, the image quality in the second display area DA2 may be improved.

Figure 10:
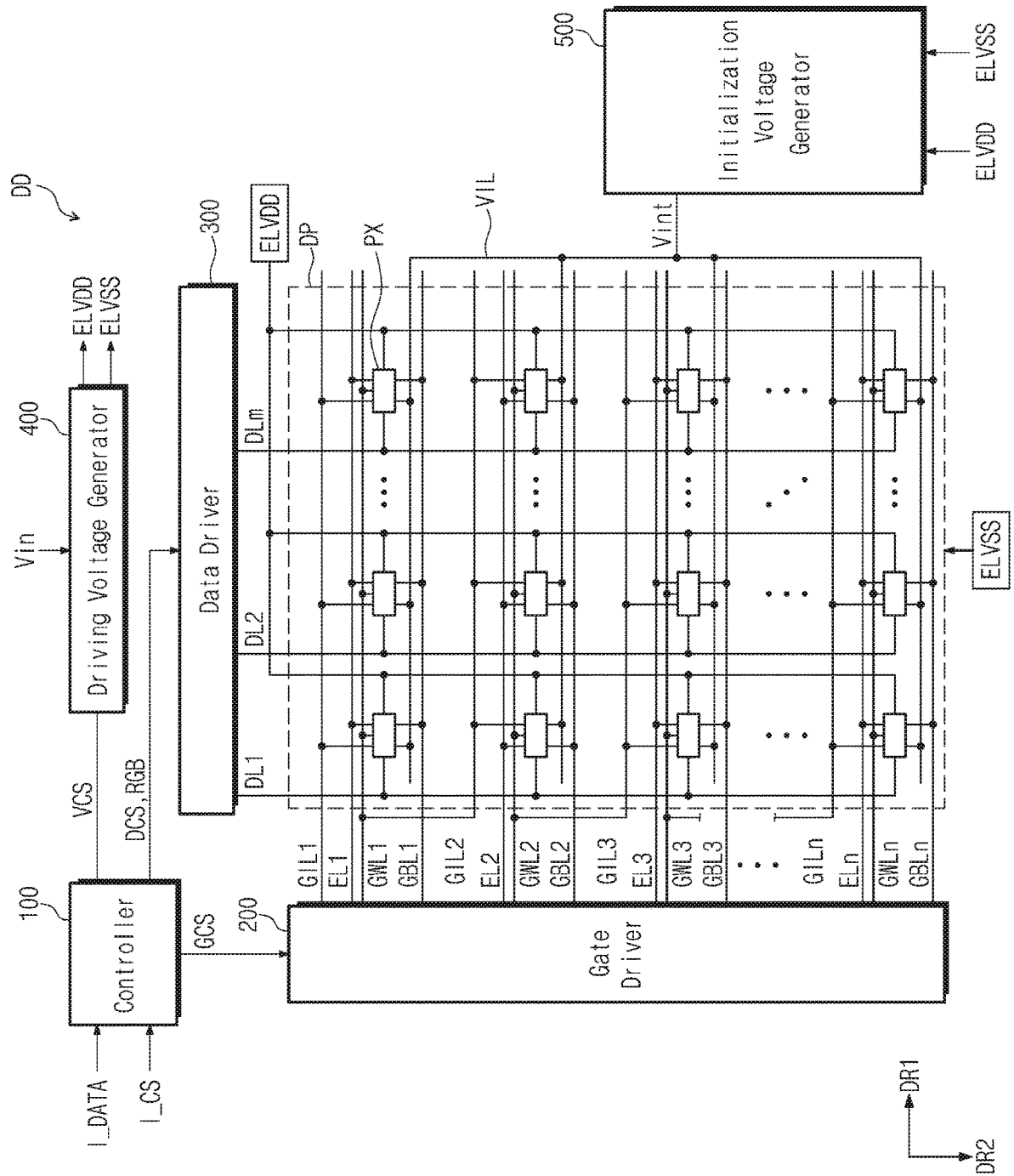
FIG. 10 is a block diagram of a display device according to an embodiment of the present disclosure.
Figure 11:
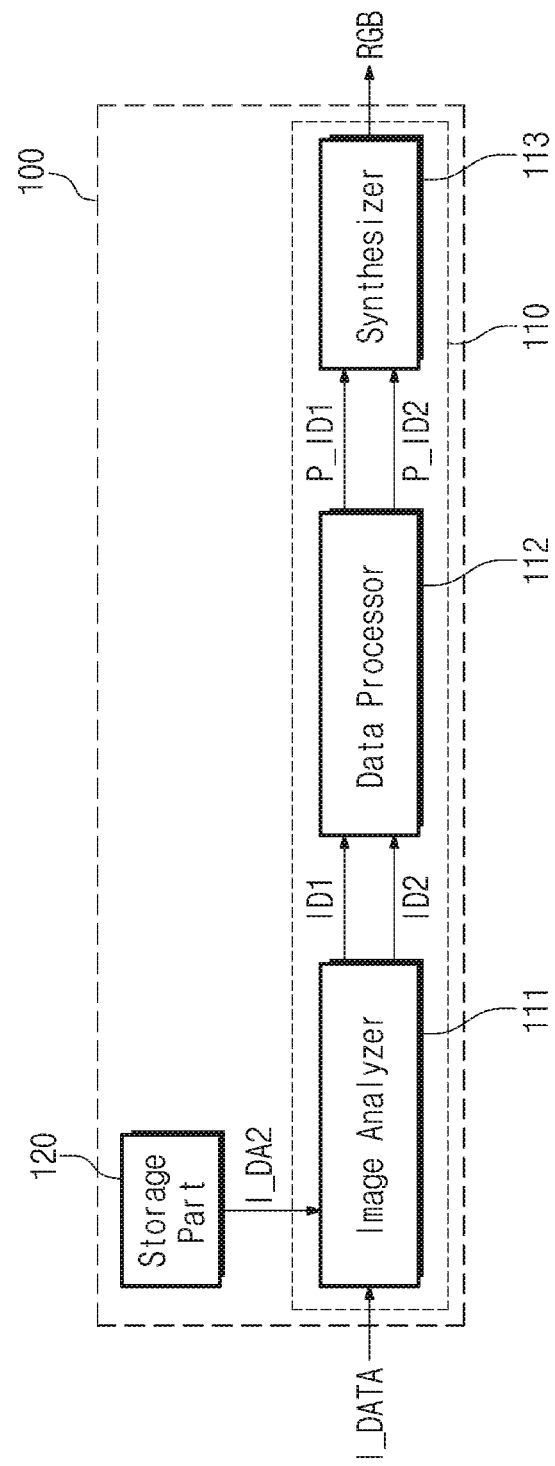
FIG. 11 is an internal block diagram of the controller shown in FIG. 10.

FIG. 10 is a block diagram of a display device according to an embodiment of the present disclosure, and FIG. 11 is an internal block diagram of the controller shown in FIG. 10.

Referring to FIG. 10, a display device DD includes a controller 100, a gate driver 200, a data driver 300, a driving voltage generator 400, an initialization voltage generator 500, and a display panel DP.

The controller 100 receives an input image signal I_DATA and an input control signal I_CS from an external source, and converts the data format of the input image signal I_DATA to meet the specification of an interface with the data driver 300 to generate image data RGB. The controller 100 converts the input control signal I_CS into various control signals DCS, GCS, and VCS and outputs them.

The gate driver 200 receives a gate control signal GCS from the controller 100. The gate control signal GCS may include a vertical start signal for starting the operation of the gate driver 200, a clock signal for determining an output timing of the signals, and the like. The gate driver 200 generates a plurality of scan signals, and sequentially outputs the plurality of scan signals to a plurality of scan lines GIL1 to GILn, GWL1 to GWLn, and GBL1 to GBLn to be described later. In addition, the gate driver 200 may generate a plurality of emission control signals in response to the gate control signal GCS, and may output a plurality of emission control signals to the plurality of emission control lines EL1 to ELn to be described later.

FIG. 10 illustrates that the plurality of gate signals and the plurality of light emission control signals are outputted from one gate driver 200, but the present disclosure is not limited thereto. As an example of the present disclosure, a scan driving circuit that generates and outputs a plurality of scan signals and an emission driving circuit that generates and outputs a plurality of emission control signals may be separately provided. Also, the gate driver 200 may include first and second gate drivers GDC1 and GDC2 shown in FIG. 2B.

The data driver 300 receives a data control signal DCS and image data RGB from the controller 100. The data driver 300 converts the image data RGB into data signals and outputs the data signals to a plurality of data lines DL1 to DLm to be described later. The data signals are analog voltages corresponding to gradation values of the image data RGB.

The driving voltage generator 400 receives a power voltage Vin from a power supply unit (not shown). The driving voltage generator 400 converts the power voltage Vin to generate a first driving voltage ELVDD and a second driving voltage ELVSS having a lower level than the first driving voltage ELVDD. The driving voltage generator 400 may include a DC-DC converter. The driving voltage generator 400 may include a boosting converter that boosts the power voltage Vin to generate a first driving voltage ELVDD. Further, the driving voltage generator 400 may include a buck converter for generating a second driving voltage ELVSS by stepping down the power voltage Vin. The driving voltage generator 400 receives a driving voltage control signal VCS from the controller 100. The driving voltage generator 400 may generate first and second driving voltages ELVDD and ELVSS in response to the driving voltage control signal VCS.

The initialization voltage generator 500 receives the first and second driving voltages ELVDD and ELVSS from the driving voltage generator 400. The initialization voltage generator 500 may generate an initialization voltage Vint by using the first and second driving voltages ELVDD and ELVSS. The initialization voltage Vint may have a voltage level different from the first and second driving voltages ELVDD and ELVSS.

The display panel DP includes a plurality of scan lines GIL1 to GILn, GWL1 to GWLn, and GBL1 to GBLn, a plurality of emission control lines EL1 to ELn, a plurality of data lines DL1 to DLm, and a plurality of pixels PX. The plurality of scan lines GIL1 to GILn, GWL1 to GWLn, and GBL1 to GBLn extend in a first direction DR1 and are arranged in a second direction DR2 orthogonal to the first direction DR1. Each of the plurality of emission control lines EL1 to ELn may be arranged parallel to a corresponding scan line among the plurality of scan lines GIL1 to GILn, GWL1 to GWLn, and GBL1 to GBLn. The plurality of data lines DL1 to DLm are electrically insulated from the plurality of scan lines GIL1 to GILn, GWL1 to GWLn, and GBL1 to GBLn and intersect the plurality of scan lines GIL1 to GILn, GWL1 to GWLn, and GBL1 to GBLn.

Each of the plurality of pixels PX is connected to a corresponding scan line among a plurality of scan lines GIL1 to GILn, GWL1 to GWLn, and GBL1 to GBLn, a corresponding emission control line among the plurality of emission control lines EL1 to ELn, and corresponding data lines among the plurality of data lines DL1 to DLm. FIG. 10 illustrates an example in which each of the plurality of pixels PX is connected to three scan lines among the plurality of scan lines GIL1 to GILn, GWL1 to GWLn, and GBL1 to GBLn, but the present disclosure is not limited thereto. For example, each pixel PX may be connected to two scan lines among the plurality of scan lines GIL1 to GILn, GWL1 to GWLn, and GBL1 to GBLn.

The display panel DP receives the first driving voltage ELVDD and the second driving voltage ELVSS. The first driving voltage ELVDD may be provided to the plurality of pixels PX through the first power line. The second driving voltage ELVSS may be provided to the plurality of pixels PX through electrodes (not shown) formed on the display panel DP or through a second power line.

The display panel DP receives the initialization voltage Vint from the initialization voltage generator 500. The initialization voltage Vint may be provided to the plurality of pixels PX through an initialization voltage line VIL.

In FIG. 10, for convenience of description, pixels PX provided in the display panel DP are not divided into the first and second pixels PX1 and PX2 (see FIG. 3A), but the display panel DP shown in FIG. 10 is divided into first and second display areas DA1 and DA2, as shown in FIG. 3A, and includes a first pixel PX1 disposed in the first display area DA1 and a second pixel PX2 disposed in the second display area DA2.

Referring to FIGS. 3A and 11, the controller 100 may include a data compensator 110 and a storage part 120. The data compensator 110 may include an image analyzer 111, a data processor 112 and a synthesizer 113. The storage part 120 may store information I_DA2 on the second display area DA2. As an example of the present disclosure, the information I_DA2 may include information on the number of second pixels PX2 provided in the second display area DA2, the size of each of the second pixels PX2, the width of the second display area DA2, and the position of the second pixels PX2.

The image analyzer 111 receives the input image signal I_DATA from an external source, and divides the input image signal I_DATA into first image data ID1 corresponding to the first display area DA1 and second image data ID2 corresponding to the second display area DA2 based on the above information I_DA2. The data processor 112 analyzes the second image data ID2 and processes the first image data ID1 and the second image data ID2 based on the analysis result. The data processor 112 may analyze the second image data ID2 in units of several frames or several lines.

As a result of the analysis, if the second image data ID2 is determined to be data for displaying a specific image such as text or line, the data processor 112 processes the first image data ID1 and the second image data ID2 so that a specific image is not displayed on the second display area DA2. The processed second image data P_ID2 does not include information on a specific image, and only the processed first image data P_ID1 may include information on the specific image. The synthesizer 113 receives the processed first and second image data P_ID1 and P_ID2 from the data processor 112, and synthesizes the processed first and second image data P_ID1 and P_ID2 to output image data RGB. That is, an image such as a caption or a line may be shifted to the first display area DA1 and displayed by the compensation operation through the data compensator 110 described above.

In particular, when diffraction pattern layers DFS1 and DFS2 including a plurality of second diffraction patterns DFP2 corresponding to the second display area DA2 are provided on the display device DD, a phenomenon in which a specific image such as letters or lines is blurred may occur due to the second diffraction patterns DFP2. In this case, by compensating the input image signal I_DATA through the data compensator 110, a phenomenon in which a specific image is displayed in a blur in the second display area DA2 may be eliminated.

Figure 12:
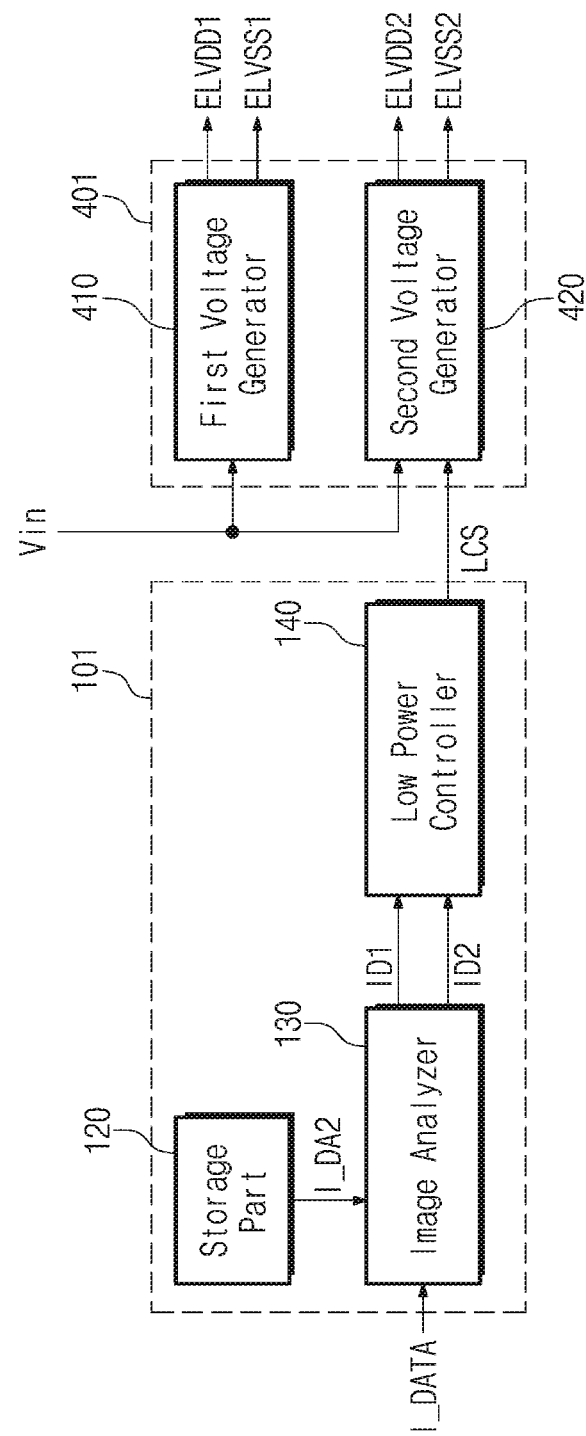
FIG. 12 is a block diagram showing a controller and a voltage generator according to an embodiment of the present disclosure.

FIG. 12 is a block diagram showing a controller and a voltage generator according to an embodiment of the present disclosure.

Referring to FIGS. 2A, 3A, and 12, the controller 101 according to an embodiment of the present disclosure may include a storage part 120, an image analyzer 130, and a low power controller 140.

The storage part 120 may store information I_DA2 on the second display area DA2. As an example of the present disclosure, the information I_DA2 may include information on the number of second pixels PX2 provided in the second display area DA2, the size of each of the second pixels PX2, the width of the second display area DA2, and the position of the second pixels PX2.

The image analyzer 130 receives the input image signal I_DATA from an external source, and divides the input image signal I_DATA into first image data ID1 corresponding to the first display area DA1 and second image data ID2 corresponding to the second display area DA2 based on the above information I_DA2. The low-power controller 140 analyzes the second image data ID2 and outputs a power control signal LCS based on the analysis result. Specifically, the low power controller 140 may determine whether the second image data ID2 changes during a preset reference frame. According to the determination result, a power control signal LCS is output.

The driving voltage generator 401 may include a first voltage generator 410 and a second voltage generator 420. The first voltage generator 410 may generate first and second driving voltages ELVDD1 and ELVSS1 supplied to the first display area DA1, and the second voltage generator 420 may generate third and fourth driving voltages ELVDD2 and ELVSS2 supplied to the second display area DA2. The power control signal LCS outputted from the low power controller 140 may be supplied to the second voltage generator 420.

The second voltage generator 420 may adjust and output the voltage levels of the third and fourth driving voltages ELVDD2 and ELVSS2 according to the power control signal LCS. When the second image data ID2 does not change during the reference frame, the low power controller 140 outputs an activated power control signal LCS to drive the second display area DA2 in a low power mode. In the low power mode, in response to the activated power control signal LCS, the second voltage generator 420 adjusts the third driving voltage ELVDD2 to have a lower level than the first driving voltage ELVDD1, and adjusts the fourth driving voltage ELVSS2 to have a higher level than the second driving voltage ELVSS1. Meanwhile, when the second image data ID2 changes during the reference frame, the low power controller 140 outputs a deactivated power control signal LCS to drive the second display area DA2 in the normal mode. In the normal mode, in response to a deactivated power control signal LCS, the second voltage generator 420 outputs the third driving voltage ELVDD2 having the same voltage level as the first driving voltage ELVDD1, and outputs the fourth driving voltage ELVSS2 having the same voltage level as the second driving voltage ELVSS1.

When a still image is displayed in the second display area DA2, the controller 101 controls the third and fourth driving voltages ELVDD2 and ELVSS2 outputted from the driving voltage generator 401 through the low power controller 140 to drive the second display area DA2 in a low power mode. Accordingly, power consumed to drive the second display area DA2 can be reduced.

Figure 13A:
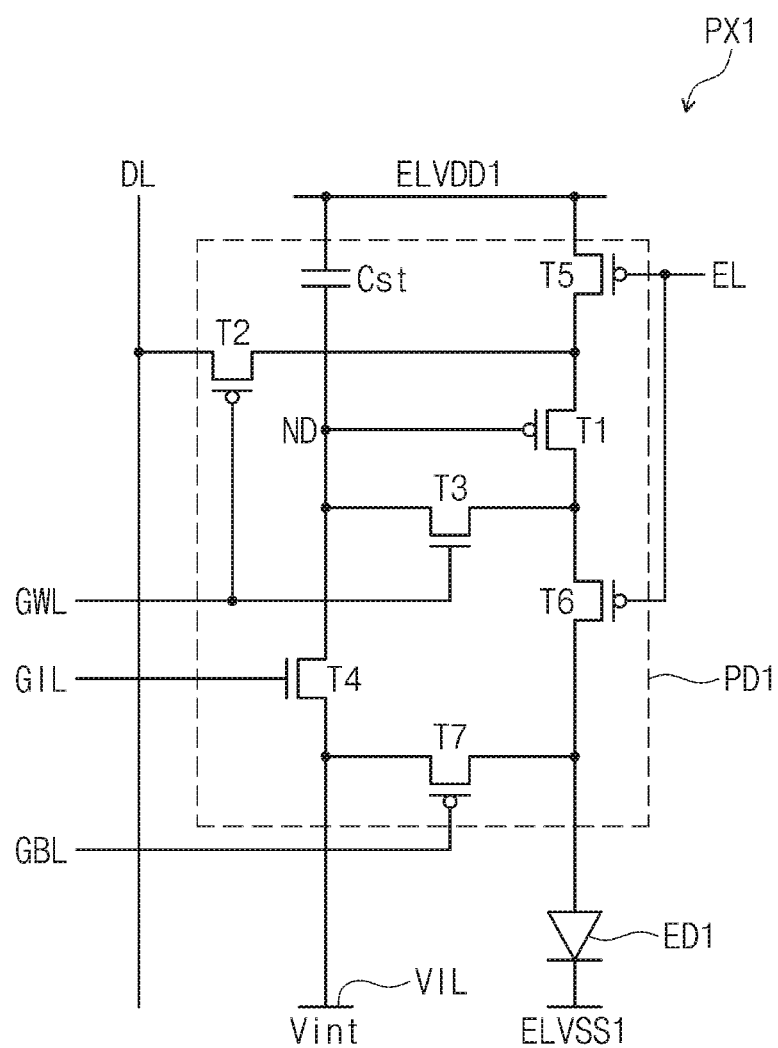
FIG. 13A is a circuit diagram of a first pixel according to an embodiment of the present disclosure.
Figure 13B:
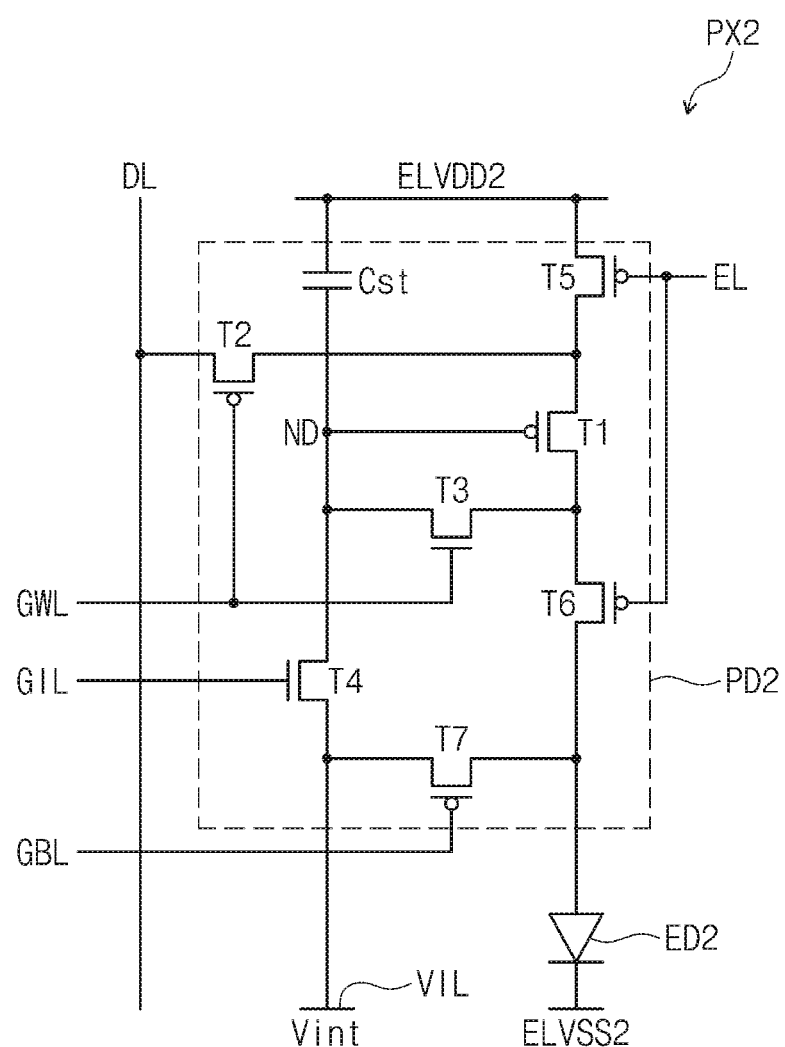
FIG. 13B is a circuit diagram of a second pixel according to an embodiment of the present disclosure.
Figure 14:
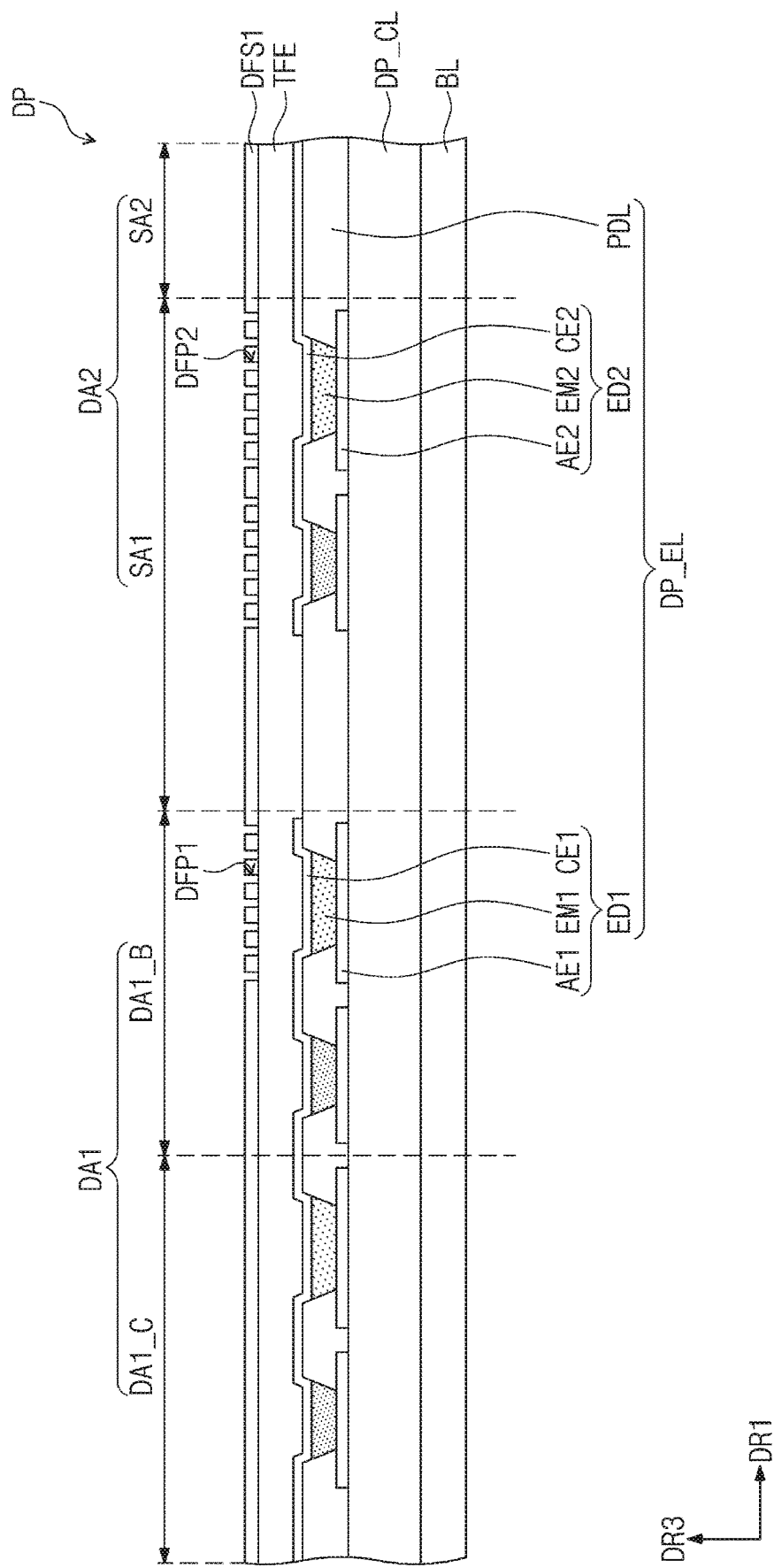
FIG. 14 is a cross-sectional view of a display panel according to an embodiment of the present disclosure.

FIG. 13A is a circuit diagram of a first pixel according to an embodiment of the present disclosure, and FIG. 13B is a circuit diagram of a second pixel according to an embodiment of the present disclosure. FIG. 14 is a cross-sectional view of a display panel according to an embodiment of the present disclosure.

Referring to FIG. 13A, the first pixel PX1 according to an embodiment of the present disclosure may include the first pixel driving circuit PD1 and the first light emitting element ED1. The first pixel driving circuit PD1 includes a plurality of transistors T1, T2, T3, T4, T5, T6, and T7 and a capacitor Cst. The plurality of transistors T1, T2, T3, T4, T5, T6, and T7 and the capacitor Cst may control an amount of current flowing through the first light emitting element ED1 in response to data signals and scan signals.

Each of the plurality of transistors T1, T2, T3, T4, T5, T6, and T7 may include an input electrode (or a source electrode), an output electrode (or a drain electrode), and a control electrode (or a gate electrode). In the present specification, for convenience, one of the input electrode and the output electrode may be referred to as a first electrode, and the other may be referred to as a second electrode.

The first electrode of the first transistor T1 may receive the first driving voltage ELVDD1 through the fifth transistor T5. The second electrode of the first transistor T1 is connected to the first anode electrode of the first light emitting element ED1 through the sixth transistor T6. The first transistor T1 may control an amount of current flowing through the first light emitting element ED1 in response to a voltage applied to the control electrode of the first transistor T1.

The second transistor T2 is connected between the data line DL and the first electrode of the first transistor T1. The control electrode of the second transistor T2 is connected to the first scan line GWL. When the first scan signal is provided to the first scan line GWL, the second transistor T2 is turned on so that the data line DL and the first electrode of the first transistor T1 are electrically connected.

The third transistor T3 is connected between the second electrode of the first transistor T1 and the control electrode of the first transistor T1. The control electrode of the third transistor T3 is connected to the first scan line GWL. When the first scan signal is provided to the first scan line GWL, the third transistor T3 is turned on so that the second electrode of the first transistor T1 and the control electrode of the first transistor T1 are electrically connected. Accordingly, when the third transistor T3 is turned on, the first transistor T1 is connected in the form of a diode.

The fourth transistor T4 is connected between the node ND and the initialization voltage line VIL. In addition, the control electrode of the fourth transistor T4 is connected to the second scan line GIL. The node ND may be a node to which the fourth transistor T4 and the control electrode of the first transistor T1 are connected. When the second scan signal is provided to the second scan line GIL, the fourth transistor T4 is turned on to provide an initialization voltage Vint to the node ND. Here, the second scan signal may be a signal generated before the first scan signal. For example, the second scan signal may be the same signal as the signal applied to the first scan line GWL of the previous row pixel.

The fifth transistor T5 is connected between the first power line and the first electrode of the first transistor T1. The sixth transistor T6 is connected between the second electrode of the first transistor T1 and the first anode electrode of the first light emitting element ED1. The control electrode of the fifth transistor T5 and the control electrode of the sixth transistor T6 are connected to the emission control line EL.

The seventh transistor T7 is connected between the initialization voltage line VIL and the first anode electrode of the first light emitting element ED1. The control electrode of the seventh transistor T7 is connected to the third scan line GBL. When the third scan signal is provided to the third scan line GBL, the seventh transistor T7 is turned on to provide the initialization voltage Vint to the first anode electrode of the first light emitting element ED1. For example, the third scan signal may be the same signal as the signal applied to the first scan line GWL of the next row pixel.

Additionally, in FIG. 13A, the control electrode of the seventh transistor T7 is shown to be connected to the third scan line GBL, but the present disclosure is not limited thereto. In another embodiment of the present disclosure, the control electrode of the seventh transistor T7 may be connected to the first scan line GWL.

FIG. 13A illustrates a case in which the first to seventh transistors T1, T2, T3, T4, T5, T6, and T7 are PMOS transistors, but is not limited thereto. In another embodiment of the present disclosure, some or all of the first to seventh transistors T1, T2, T3, T4, T5, T6, and T7 may be formed of an NMOS transistor.

The capacitor Cst is disposed between the first power line and the node ND. The capacitor Cst stores a voltage corresponding to the data signal. When the fifth and sixth transistors T5 and T6 are turned on, the amount of current flowing through the first transistor T1 may be determined according to the voltage stored in the capacitor Cst.

The first light emitting element ED1 may be electrically connected to the sixth transistor T6 and the second power line. The first anode electrode of the first light emitting element ED1 may receive the first driving voltage ELVDD1 through the sixth transistor T6, and the first cathode electrode of the first light emitting element ED1 may be connected to a second power line to receive a second driving voltage ELVSS1. The second driving voltage ELVSS1 has a lower level than the first driving voltage ELVDD1. Accordingly, the first light emitting element ED1 may emit light according to a voltage corresponding to a difference between the first driving voltage ELVDD1 and the second driving voltage ELVSS1 transmitted through the sixth transistor T6.

FIG. 13A illustrates a structure in which the first pixel driving circuit PD1 includes seven transistors T1, T2, T3, T4, T5, T6, and T7 and one capacitor Cst as an example of the present disclosure, but the present disclosure is not limited thereto. The first pixel driving circuit PD1 may have various circuit configurations in addition to the circuit configuration shown in FIG. 13A.

Referring to FIGS. 13B and 14, the second pixel PX2 according to an embodiment of the present disclosure may include the second pixel driving circuit PD2 and the second light emitting element ED2. The second pixel driving circuit PD2 may have the same configuration as the first pixel driving circuit PD1. That is, the second pixel driving circuit PD2 includes seven transistors T1, T2, T3, T4, T5, T6, and T7 and one capacitor Cst. However, the second pixel driving circuit PD2 is connected to the third and fourth power lines. That is, the second pixel driving circuit PD2 receives the third driving voltage ELVDD2 through the third power line, and receives the fourth driving voltage ELVSS2 through the fourth power line. The third driving voltage ELVDD2 may have a voltage level equal to or higher than that of the first driving voltage ELVDD1. The fourth driving voltage ELVSS2 may have a voltage level equal to or lower than that of the second driving voltage ELVSS1. The third power line is electrically separated from the first power line, and the fourth power line is electrically separated from the second power line. Accordingly, the first pixels PX1 may receive a driving voltage different from that of the second pixels PX2.

The second light emitting element ED2 may be electrically connected to the sixth transistor T6 and the fourth power line. The second anode electrode of the second light emitting element ED2 receives the third driving voltage ELVDD2 through the sixth transistor T6, and the second cathode electrode of the second light emitting element ED2 is connected to the fourth power line to receive the fourth driving voltage ELVSS2. The fourth driving voltage ELVSS2 has a level lower than that of the third driving voltage ELVDD2. Accordingly, the second light emitting element ED2 may emit light according to a voltage corresponding to a difference between the third driving voltage ELVDD2 and the fourth driving voltage ELVSS2 transmitted through the sixth transistor T6.

In particular, the third driving voltage ELVDD2 higher than the first driving voltage ELVDD1 and/or the fourth driving voltage ELVSS2 lower than the second driving voltage ELVSS1 may be applied to each of the second pixels PX2. Accordingly, the luminance of the second pixels PX2 may be higher than the luminance of the first pixels PX1 in the same gradation. Accordingly, a difference in luminance and color coordinates between the first and second display areas DA1 and DA2 caused by a difference in resolution between the first and second display areas DA1 and DA2 may be compensated.

As another example, in order to operate the second display area DA2 in a low power mode, the third driving voltage ELVDD2 lower than the first driving voltage ELVDD1 and/or the fourth driving voltage ELVSS2 higher than the second driving voltage ELVSS1 may be applied to each of the second pixels PX2. Accordingly, power consumed to drive the second display area DA2 can be reduced.

In this way, in order to apply different driving voltages to the first pixels PX1 and the second pixels PX2, the first cathode electrodes CE1 of the first pixels PX1 and the second cathode electrodes CE2 of the second pixels PX2 may be electrically separated from each other. The first cathode electrodes CE1 are integrally formed as one complete electrode, and the second cathode electrodes CE2 are integrally formed as one complete electrode. However, the first cathode electrodes CE1 are electrically separated from the second cathode electrodes CE2 to receive different driving voltages. The first cathode electrodes CE1 receive the second driving voltage ELVSS1, and the second cathode electrodes CE2 receive the fourth driving voltage ELVSS2.

According to an embodiment of the present disclosure, an edge part and a corner part of the display device are extended to a display area capable of displaying an image, thereby providing a display device having an enlarged display area.

In addition, it is possible to eliminate the problem of lowering the resolution due to the gate driver in the second display area, and the overall display quality of the display area may be improved by compensating for the difference in luminance and color coordinates between the first and second display areas.

Although the example embodiments of the present disclosure have been described, it is understood that the present disclosure should not be limited to these example embodiments but various changes and modifications can be made by one ordinary skilled in the art within the spirit and scope of the present disclosure as hereinafter claimed.

What is claimed is:

1. A display device comprising:
a display panel including a plurality of first pixels disposed in a first display area, and a plurality of second pixels disposed in a second display area adjacent to the first display area;
a gate driver disposed in the second display area of the display panel and configured to drive the first and second pixels; and
a diffraction pattern layer including a plurality of second diffraction patterns,
wherein each of the first pixels comprises a first light emitting element,
each of the second pixels comprises a second light emitting element, the first light emitting element and the second light emitting element output same color light as each other, and
wherein the plurality of second diffraction patterns is only disposed on the second light emitting element and is not disposed on the first light emitting element.

2. The display device of claim 1, wherein the diffraction pattern layer further comprises a plurality of first diffraction patterns disposed on boundary pixels disposed adjacent to the second display area among the first pixels, and
the plurality of first diffraction patterns is not disposed on the first pixels that are not adjacent to the second display area.

3. The display device of claim 1, wherein each of the second pixels further comprises:
a second pixel driving circuit configured to drive the second light emitting element,
wherein the second display area comprises:
a first sub area in which second pixel driving circuits of the second pixels are disposed; and
a second sub area in which the gate driver is disposed.

4. The display device of claim 3, wherein the second light emitting elements of a first group among the second pixels are disposed on the second pixel driving circuits in the first sub area, and
wherein the second light emitting elements of a second group among the second pixels are disposed on the gate driver in the second sub area.

5. The display device of claim 1, wherein a number of the second pixels disposed per unit area in the second display area is less than or equal to a number of the first pixels disposed per unit area in the first display area.

6. The display device of claim 5, wherein the plurality of second diffraction patterns are arranged on each of the second pixels.

7. The display device of claim 5, wherein a size of each of the second pixels is greater than or equal to a size of each of the first pixels.

8. The display device of claim 1, wherein the display panel further comprises an encapsulating layer covering the first and second pixels.

9. The display device of claim 8, wherein the diffraction pattern layer is disposed on the encapsulating layer.

10. The display device of claim 8, further comprising an input detection layer disposed on the encapsulating layer,
wherein the diffraction pattern layer is disposed on the input detection layer.

11. The display device of claim 1, further comprising a data driver configured to generate a data signal to be provided to the first and second pixels based on image data; and
a controller configured to control driving of the data driver and the gate driver.

12. The display device of claim 11, wherein the controller comprises:
a storage part configured to store information on the second display area; and
a data compensator configured to receive an input image signal, divide the input image signal into first image data corresponding to the first display area and second image data corresponding to the second display area based on the information, and compensate the first and second image data based on an analysis result obtained by analyzing the second image data.

13. The display device of claim 12, wherein the data compensator comprises:

an image analyzer configured to divide the input image signal into first image data corresponding to the first display area and second image data corresponding to the second display area;

a data processor configured to analyze the second image data and process the first and second image data based on an analysis result; and a synthesizer configured to synthesize the processed first and second image data to output the image data.

14. The display device of claim 1, further comprising a driving voltage generator including:

a first voltage generator configured to supply first and second driving voltages to the first pixels; and a second voltage generator configured to supply third and fourth driving voltages to the second pixels.

15. The display device of claim 14, wherein each of the first pixels further comprises at least one first transistor, and wherein each of the second pixels further comprises at least one second transistor.

16. The display device of claim 15, wherein the second driving voltage is supplied to a first cathode electrode of the first light emitting element, and wherein the fourth driving voltage is supplied to a second cathode electrode of the second light emitting element.

17. The display device of claim 16, wherein the first and second cathode electrodes are electrically separated.

18. The display device of claim 16, wherein a first anode electrode of the first light emitting element receives the first driving voltage through the at least one first transistor, and wherein a second anode electrode of the second light emitting element receives the third driving voltage through the at least one second transistor.

19. The display device of claim 14, further comprising a controller for controlling driving of the third and fourth driving voltages outputted from the second voltage generator, wherein the controller comprises:

a storage part configured to store information on the second display area;

an image analyzer configured to divide input image signal into first image data corresponding to the first display area and second image data corresponding to the second display area based on the information; and a low power controller configured to determine whether the second image data changes during a preset reference frame, and output a power control signal for adjusting the third and fourth driving voltages outputted from the second voltage generator according to a determination result.

20. The display device of claim 19, wherein when the second image data does not change during the reference frame, the second voltage generator adjusts the third driving voltage to have a lower voltage level than the first driving voltage or adjusts the fourth driving voltage to a higher voltage level than the second driving voltage in response to the activated power control signal, and wherein when the second image data changes during the reference frame, the second voltage generator outputs the third and fourth driving voltages having the same voltage level as the first and second driving voltages, respectively, in response to the deactivated power control signal.

* * * * *